US012813165B2

(12) United States Patent
Sun et al.

(10) Patent No.: US 12,813,165 B2
(45) Date of Patent: Nov. 24, 2026

(54) ORDERED, CUBIC-β-ZRNB ALLOYS WITH HIGH CRITICAL TEMPERATURE IN THE THEORETICAL LIMIT, METHOD OF MAKING SAME, AND USE FOR SUPERCONDUCTING APPLICATIONS

(71) Applicant: Cornell University, Ithaca, NY (US)

(72) Inventors: Zeming Sun, Ithaca, NY (US); Thomas Oseroff, Ithaca, NY (US); Matthias Liepe, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 412 days.

(21) Appl. No.: 18/507,843

(22) Filed: Nov. 13, 2023

(65) Prior Publication Data

US 2024/0164222 A1 May 16, 2024

Related U.S. Application Data

(60) Provisional application No. 63/383,387, filed on Nov. 11, 2022.

(51) Int. Cl.

| | |
|---|---|
| ***C22C 27/02*** | (2006.01) |
| ***C25D 9/04*** | (2006.01) |
| ***H10N 60/01*** | (2023.01) |
| ***H10N 60/80*** | (2023.01) |
| ***H10N 60/85*** | (2023.01) |

(52) U.S. Cl.

CPC ............. *H10N 60/85* (2023.02); *C22C 27/02* (2013.01); *C25D 9/04* (2013.01); *H10N 60/0156* (2023.02); *H10N 60/805* (2023.02); *H10N 60/855* (2023.02)

(58) Field of Classification Search

CPC .......... C22C 27/02; C25D 9/04; H10N 60/85; C22F 1/186

See application file for complete search history.

(56) References Cited

U.S. PATENT DOCUMENTS

| | | | | |
|---|---|---|---|---|
| 2,985,531 | A * | 5/1961 | Gordon | C22C 27/02 420/422 |
| 3,215,569 | A | 11/1965 | Kneip et al. | |
| 3,253,191 | A | 5/1966 | Treuting et al. | |
| 3,294,529 | A | 12/1966 | Haverstraw et al. | |
| 3,472,705 | A | 10/1969 | Gregory | |
| 3,504,105 | A | 3/1970 | Bogner et al. | |
| 3,547,713 | A | 12/1970 | Steinemann et al. | |
| 5,647,923 | A | 7/1997 | Buescher | |
| 10,485,090 | B2 * | 11/2019 | Myneni | H05H 7/20 |
| 2017/0298511 | A1 | 10/2017 | Lansalot-Matras et al. | |

FOREIGN PATENT DOCUMENTS

| | | | |
|---|---|---|---|
| DE | 1234033 | B | 2/1967 |
| GB | 978393 | A | 12/1964 |

OTHER PUBLICATIONS

Ciovati, Gianluigi. "Effect of low-temperature baking on the radio-frequency properties of niobium superconducting cavities for particle accelerators." Journal of applied physics 96.3 (2004): 1591-1600.*

Sharping, Jay E., et al. "Joints and shape imperfections in high-Q 3D SRF cavities for RF optomechanics." Journal of applied physics 128.7 (2020).*

Spitzer, 1970, Preparation and superconducting properties of niobium-zirconium thin films Spitzer, HJ Abstract Journal of Vacuum Science & Technology vol. 7, Issue 5, p. 537-542.

Bashkin, Superconducting transition temperature of the equiatomic ZrNb alloy at pressures to 56.4 GPa, "Physica C: Superconductivity", vol. 434, Issue 2, p. 191-193, 2006.

Ponyatovsky, Superconductivity of BCC Zr and Zr-Nb alloys at high pressures, Physics of the Solid State, vol. 51, Issue 9, p. 1785-1788, 2009.

Baron, Effect of Heat Treatment on the Temperature Corresponding to the Transformation of Nb-Zr Alloys into the Superconducting State, Baron V.V., In: Savitskii, E.M., Baron, V.V. (eds) Physics and Metallurgy of Superconductors; Springer, New York, NY; 1970; pp. 45-47.

Cuello, Structure and transformations of metastable phases in Zr-Nb and Ti-V alloys, Applied Physics A—Materials Science & Processing vol. 74, p. S1069-S1071, Supplement S, Part 2, Published Dec. 2002 International Conference on Neutron Scattering; Munich, Germany.

Aurelio, Structural properties and stability of metastable phases in the Zr-Nb system: Part I. Systematics of quenching-and-aging experiments, Metallurgical and Materials Transactions A—Physical Metallurgy and Materials Science, vol. 32A, Issue 8, p. 1903-1910, 2001.

Aurelio, Structural properties and stability of metastable phases in the Zr-Nb system: Part II. Aging of Bcc (beta) alloys and assessment of beta-Zr, Metallurgical and Materials Transactions A—Physical Metallurgy and Materials Science, vol. 34A, Issue 12, p. 2771-2779, 2003.

(Continued)

*Primary Examiner* — Jessee R Roe

(74) *Attorney, Agent, or Firm* — HESLIN ROTHENBERG FARLEY & MESITI P.C.

(57) ABSTRACT

Provided is a niobium-zirconium (Nb—Zr) alloy comprising an ordered body-centered cubic (bcc) β-Nb—Zr phase, methods for making the same, a superconducting radio-frequency (SRF) cavity surface comprising the Nb—Zr alloy, a particle accelerator wherein an SRF cavity comprising the Nb—Zr alloy, a superconductor-insulator-superconductor tunnel junction (SIS) wherein a first superconductor/electrode and the second superconductor/electrode comprise the Nb—Zr alloy, and a quantum computer or quantum computing device comprising an SRF cavity or a resonator wherein at least a portion of at least one surface of the SRF cavity or resonator comprising the Nb—Zr alloy. The Nb—Zr alloy, e.g., produced under ambient conditions, comprises less than or equal to 50 at. % Zr and yields critical temperatures up to, e.g., 16.5 K.

14 Claims, 25 Drawing Sheets

(56) References Cited

OTHER PUBLICATIONS

Santhanam, Microstructure and flux pinning in commercial Nb-25 percent Zr superconducting wires, "Journal of Applied Physics", vol. 46, Issue 11, p. 4951-4956, 1975.
Kneip, Superconductivity in heat-treated Nb-Zr alloys, p. 754, col. 2 para 4-5 Journal of Applied Physics, vol. 33, Issue 2, p. 754-755, 1962.
Milne, Superconducting properties of Nb—25percent Zr relevant to its use in a superconducting power cable, "Cryogenics", vol. 12, Issue 3, p. 176-179, 1972.
Narasimhan, Superconducting transition behavior of Zr-Nb binary-alloys "Journal of Nuclear Materials", vol. 43, Issue 3, p. 258-268, 1972.
Sekine, Structure and superconducting properties of Nb-Zr alloy-films made by a high-rate sputtering, "Journal of the Japan Institute of Metals", vol. 42, Issue 4, p. 424-432, 1978.
Abriata, The Nb-Zr (Niobium-Zirconium) system p. 39 col 1 para 4 "Journal of Phase Equilibria", vol. 3, Issue 1, p. 34-44, 1982.
Berghout, Phase Equilibria in Superconducting Niobium-Zirconium Alloys, p. 293 col 1 para 2-col. 2 para 1 Physics Letters vol. 1, Issue 7, p. 292-295, 1962.
Z. Sun, T. Oseroff, et al. ZrNb(CO) RF superconducting thin film with high critical temperature in the theoretical limit, Advanced Electronic Materials, vol. 9, Issue 8, 2300151, 2023.
N. Sitaraman, Z. Sun, et al. Enhanced surface superconductivity of niobium by zirconium doping, Physical Review Applied, vol. 20, 014064, 2023.
Z. Sun, T. Oseroff, et al. Materials Design for superconducting RF cavities: electroplating Sn, Zr, and Au onto Nb and chemical vapor deposition, presented at the International Conference on Radio-Frequency Superconductivity, Grand Rapids, MI, Jun. 2023.
Z. Sun, M. U. Liepe, T. Oseroff, First demonstration of a ZrNb alloyed surface for superconducting radio-frequency cavities, 5th North American Particle Accelerator Conference, 2022.

* cited by examiner

ORDERED, CUBIC-β-ZRNB ALLOYS WITH HIGH CRITICAL TEMPERATURE IN THE THEORETICAL LIMIT, METHOD OF MAKING SAME, AND USE FOR SUPERCONDUCTING APPLICATIONS

CROSS REFERENCE TO RELATED APPLICATIONS

This application claims priority to U.S. provisional application No. 63/383,387, filed on Nov. 11, 2022, the entire contents of which are hereby incorporated by reference herein.

BACKGROUND

Superconducting radio-frequency (SRF) cavities are critical components in particle accelerator applications, such as free-electron lasers (the fourth-generation light source) and high-energy particle colliders. The performance metrics include the RF surface resistance, which determines energy dissipation, and the maximum accelerating gradient, in addition to considerations for cost and size reduction. Achieving enhanced performance for energy-efficient, cost-effective, and compact accelerators requires searching for new SRF materials beyond conventional niobium. Niobium-zirconium (Nb—Zr) alloys emerge as a promising material, offering increased critical temperatures and superheating critical fields compared to niobium. Despite some early studies on bulk random alloys, the challenge lies in attaining the desired phase and composition in thin-film surface alloys that yield an optimal combination of superconducting parameters suitable for RF applications. Thus, to, inter alia, address the fundamental and technical challenges associated with cavity production, a need remains for novel and improved manufacturing of SRF cavities, whilst allowing for improved performance under RF conditions and surpassing the limitations of bulk random-alloy structures.

While certain aspects of conventional technologies have been discussed to facilitate disclosure of the invention, the Applicant in no way disclaims these technical aspects, and it is contemplated that the claimed invention may encompass one or more of the conventional technical aspects discussed herein.

In this application, where a document, act or item of knowledge is referred to or discussed, this reference or discussion is not an admission that the document, act or item of knowledge or any combination thereof was, at the priority date, publicly available, known to the public, part of common general knowledge, or otherwise constitutes prior art under the applicable statutory provisions; or is known to be relevant to an attempt to solve any problem with which this specification is concerned.

SUMMARY OF THE INVENTION

Briefly, embodiments of the present invention provide for improved niobium-zirconium (Nb—Zr) alloys, and to methods of making the same.

Some inventive embodiments and related information and attributes/properties thereof are discussed, for example, in the following, which are incorporated by reference herein:

Z. Sun, T. Oseroff, et al. ZrNb(CO) RF superconducting thin film with high critical temperature in the theoretical limit, Advanced Electronic Materials, Volume 9, Issue 8, 2300151, 2023.

N. Sitaraman, Z. Sun, et al. Enhanced surface superconductivity of niobium by zirconium doping, Physical Review Applied, Volume 20, 014064, 2023.

Z. Sun, T. Oseroff, et al. Materials Design for superconducting RF cavities: electroplating Sn, Zr, and Au onto Nb and chemical vapor deposition, presented at the International Conference on Radio-Frequency Superconductivity, Grand Rapids, MI, June 2023.

Z. Sun, M. U. Liepe, T. Oseroff, First demonstration of a ZrNb alloyed surface for superconducting radio-frequency cavities, 5th North American Particle Accelerator Conference, 2022.

In a first aspect, the invention provides a Nb—Zr alloy comprising an ordered body-centered cubic (bcc) β-Nb—Zr phase, wherein the Nb—Zr alloy comprises less than or equal to 50 at. % Zr.

In a second aspect, the invention provides a superconducting radio-frequency (SRF) surface comprising the Nb—Zr alloy according to the first aspect of the invention.

In a third aspect, the invention provides a method of preparing an ordered Nb—Zr alloy according to the first aspect of the invention, said method comprising:

performing (a) or (b):

(a) evaporating a zirconium (Zr) target on a niobium (Nb) surface; or (b) electrochemically reacting zirconium tetrafluoride ($ZrF_4$) with the Nb surface; thereby forming a Nb—Zr material; and thermally annealing the Nb—Zr material;

thereby forming the Nb—Zr alloy.

These and other objects, features, and advantages of this invention will become apparent from the following detailed description of the various aspects of the invention taken in conjunction with the accompanying drawings.

DETAILED DESCRIPTION

Figure 1:
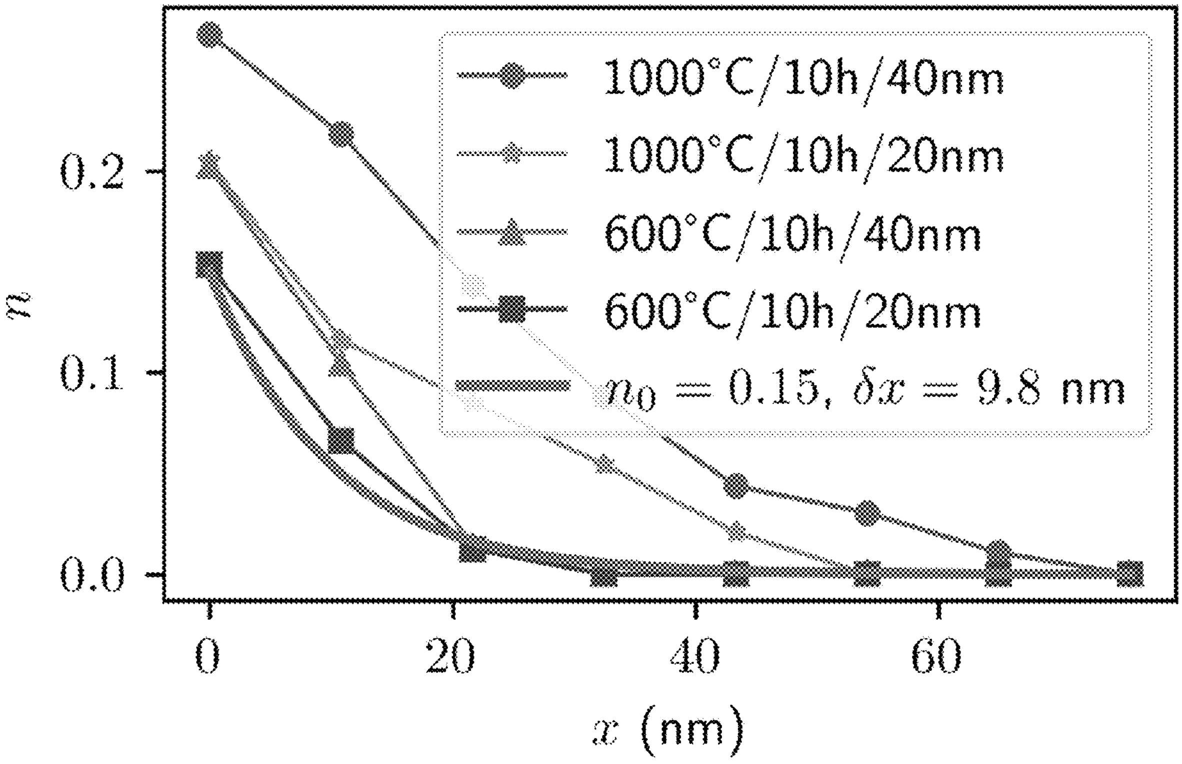
FIG. 1 depicts the Zr concentration n vs. depth x for Nb—Zr samples prepared under various annealing conditions, as well as for the profile n(x) in the equation $n(x)=n_0e^{-x/dx}$.

In the following description, reference is made to the accompanying drawings and text that form a part hereof, and in which is shown by way of illustration specific embodiments which may be practiced. These embodiments are described in detail to enable those skilled in the art to practice the invention, and it is to be understood that other embodiments may be utilized and that structural, logical, and electrical changes may be made without departing from the scope of the present invention. The following and descriptions of example embodiments are, therefore, not to be taken in a limited sense, and the scope of the present invention is defined by the appended claims.

Embodiments of the present invention provide methods that resolve limitations of superconducting properties of radio-frequency cavity surfaces, namely, by providing novel niobium-zirconium alloys having improved critical temperatures ($T_c$), maximal radio-frequency surface resistance, and/or minimal cooling costs.

The terminology used herein is standard terminology in the art and is used as understood by persons of skill in the art.

Briefly, embodiments of the present invention provide for improved niobium-zirconium (Nb—Zr) alloys, and to methods of making the same.

In a first aspect, the invention provides a Nb—Zr alloy comprising an ordered body-centered cubic (bcc) β-Nb—Zr phase, wherein the Nb—Zr alloy comprises less than or equal to 50 atomic (at. %) Zr.

For example, in some embodiments, the Nb—Zr alloy comprises 1 to 50 at. % Zr (e.g., 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 at. % Zr), including any and all ranges and subranges therein (e.g., 10-40 at. %, 15 to 30 at. %, 15 to 27 at %, etc.).

In some embodiments, the Nb—Zr alloy comprises greater than 50 at. % Nb.

In some inventive embodiments, the Nb—Zr alloy comprises 10 to 40 wt. % Zr (e.g., 15 to 27 wt. %).

In further inventive embodiments, Nb and Zr account for at least 50 at. % of the Nb—Zr alloy (e.g., at least 85 at. % of the alloy).

In some inventive embodiments, the Nb—Zr alloy, produced under ambient conditions, has a critical temperature ($T_c$) greater than 9 K (e.g., greater than 9.0, 9.1, 9.2, 9.3, 9.4, 9.5, 9.6, 9.7, 9.8, 9.9, 10.0, 10.1, 10.2, 10.3, 10.4, 10.5, 10.6, 10.7, 10.8, 10.9, 11.0, 11.1, 11.2, 11.3, 11.4, 11.5, 11.6, 11.7, 11.8, 11.9, 12.0, 12.1, 12.2, 12.3, 12.4, 12.5, 12.6, 12.7, 12.8, 12.9, 13.0, 13.1, 13.2, 13.3, 13.4, 13.5, 13.6, 13.7, 13.8, 13.9, 14.0, 14.1, 14.2, 14.3, 14.4, 14.5, 14.6, 14.7, 14.8, 14.9, or 15.0 K).

In further embodiments, the Nb—Zr alloy, produced under ambient conditions, has a $T_c$ of 9-17 K (e.g., 9.0, 9.1, 9.2, 9.3, 9.4, 9.5, 9.6, 9.7, 9.8, 9.9, 10.0, 10.1, 10.2, 10.3, 10.4, 10.5, 10.6, 10.7, 10.8, 10.9, 11.0, 11.1, 11.2, 11.3, 11.4, 11.5, 11.6, 11.7, 11.8, 11.9, 12.0, 12.1, 12.2, 12.3, 12.4, 12.5, 12.6, 12.7, 12.8, 12.9, 13.0, 13.1, 13.2, 13.3, 13.4, 13.5, 13.6, 13.7, 13.8, 13.9, 14.0, 14.1, 14.2, 14.3, 14.4, 14.5, 14.6, 14.7, 14.8, 14.9, 15.0, 15.1, 15.2, 15.3, 15.4, 15.5, 15.6, 15.7, 15.8, 15.9, 16.0, 16.1, 16.2, 16.3, 16.4, 16.5, 16.6, 16.7, 16.8, 16.9, or 17.0 K), including any and all ranges and subranges therein (e.g., 11 to 16.5 K, 11 to 16 K, 13 to 16 K, etc.).

In some embodiments, the Nb—Zr alloy comprises zirconium dioxide ($ZrO_2$).

In some embodiments, the Nb—Zr alloy is present in the form of a film. In some embodiments, the film has a thickness of 1 to 25,000 nm (e.g., 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, or 25000 nm, etc.), including any and all ranges and subranges therein (e.g., 10 to 300 nm, 10 to 100 nm, 20 to 100 nm, 20 to 40 nm, etc.).

In some embodiments, the inventive Nb—Zr alloy has an increased critical field as compared to Nb.

In some embodiments, the Nb—Zr alloy has reduced BCS resistance as compared to Nb.

In some embodiments, the Nb—Zr alloy comprises less than 0.5 wt % hexagonal Zr phase (e.g., less than 0.5, 0.4, 0.3, 0.2, 0.1, 0.09, 0.08, 0.07, 0.06, 0.05, 0.04, 0.03, 0.02, or 0.01 wt %). In some embodiments, the Nb—Zr alloy comprises 0 wt % hexagonal Zr phase.

In some inventive embodiments, the Nb—Zr alloy comprises rock-salt NbZrC or NbC.

In some embodiments, the Nb—Zr alloy is present at a surface region of an Nb substrate. In further embodiments, the surface region is 1 to 25,000 nm thick (e.g., 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, or 25000, etc.), including any and all ranges and subranges therein (e.g., 20 to 300 nm).

In a second aspect, the invention provides a superconducting radio-frequency (SRF) surface comprising the Nb—Zr alloy according to the first aspect of the invention.

In further inventive embodiments, the Nb—Zr alloy is present as a film on the SRF cavity surface.

In a third aspect, the invention provides a method of preparing an ordered Nb—Zr alloy according to the first aspect of the invention, said method comprising:

performing (a) or (b)

(a) evaporating a zirconium (Zr) target on a niobium (Nb) surface; or (b) electrochemically reacting zirconium tetrafluoride ($ZrF_4$) with the Nb surface; thereby forming a Nb—Zr material; and thermally annealing the Nb—Zr material;

thereby forming the Nb—Zr alloy.

In a further embodiment, the method comprises thermally annealing the Nb—Zr material is performed under vacuum (e.g., under $10^{-7}$ torr-$10^{-6}$ torr vacuum, e.g., under $2\times10^{-7}$ torr).

In some embodiments, the method comprises:

performing (a):

(a) evaporating (e.g., physical-vapor depositing) a Zr target on a Nb surface; thereby forming a Nb—Zr material;

and further comprising:

subjecting the Nb—Zr material to an acid etch.

In a further embodiment, said (a) evaporating a Zr target on a Nb surface comprises using e-beam or thermal evaporation of a Zr target on the Nb surface.

In a further embodiment, said (a) evaporating a Zr target on a Nb surface achieves substitutional Zr doping of the surface, thereby incorporating Zr atoms into a cubic structure of the surface.

In a further embodiment, the method comprises, after (a), subjecting the Nb—Zr material to the acid etch, which comprises etching the Nb—Zr material with hydrofluoric acid (HF).

In a further embodiment, said etching removes hexagonal Zr phase from the Nb—Zr material.

In yet another embodiment, the method comprises:

performing (b):

(b) electrochemically reacting Zr with the Nb surface; thereby forming a Nb—Zr material.

In some embodiments, said (b) electrochemically reacting Zr with the Nb surface comprises electrochemically inducing reaction between the $ZrF_4$ (or other Zr precursor) and Nb, thereby depositing Zr on the Nb surface, thereby forming the Nb—Zr material, which comprises precursor Nb—Zr alloy containing impurities.

In further embodiments, said electrochemically depositing Zr on the Nb surface comprises using a three-electrode setup utilizing a platinum (Pt) counter electrode, Nb working electrode, and pseudo reference electrode, employed together.

In further embodiments, comprising electrochemically depositing the Zr on the Nb surface for 1 min to 50 hours (e.g., for 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 minutes, or for 1.5, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50 hours), including any and all ranges and subranges therein (e.g., for 2 to 10 hours).

In yet another embodiment, said electrochemically depositing the Zr:

is performed in an inert gas environment (e.g., with $O_2$ and $H_2O$ levels below 0.5 ppm);

and comprises:

dissolving $ZrF_4$ and LiF in ionic liquids (e.g., 1-butyl-1-methylpyrrolidinium bis(trifluoromethylsulfonyl) imide) (e.g., at different concentrations, for example, 0.48 M-1.24 M $ZrF_4$ and 0.98-4.8 times LiF addition);

heating from 30 to 200° C. (e.g., heating at 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, or 200° C.); and depositing the Zr while controlling the depositing potential and current via potentiostat (e.g., for 2 to 10 hours); thereby forming the Nb—Zr material.

In some embodiments, the method comprises, after said electrochemically depositing the Zr, thermally annealing the Nb—Zr material at 300-1100° C. (e.g., at 300, 310, 320, 330, 340, 350, 360, 370, 380, 390, 400, 410, 420, 430, 440, 450, 460, 470, 480, 490, 500, 510, 520, 530, 540, 550, 560, 570, 580, 590, 600, 610, 620, 630, 640, 650, 660, 670, 680, 690, 700, 710, 720, 730, 740, 750, 760, 770, 780, 790, 800, 810, 820, 830, 840, 850, 860, 870, 880, 890, 900, 910, 920, 930, 940, 950, 960, 970, 980, 990, 1000, 1010, 1020, 1030, 1040, 1050, 1060, 1070, 1080, 1090, or 1100° C.) for 20 minutes to 12 hours (e.g., for 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 minutes, or for 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, 5.0, 5.1, 5.2, 5.3, 5.4, 5.5, 5.6, 5.7, 5.8, 5.9, 6.0, 6.1, 6.2, 6.3, 6.4, 6.5, 6.6, 6.7, 6.8, 6.9, 7.0, 7.1, 7.2, 7.3, 7.4, 7.5, 7.6, 7.7, 7.8, 7.9, 8.0, 8.1, 8.2, 8.3, 8.4, 8.5, 8.6, 8.7, 8.8, 8.9, 9.0, 9.1, 9.2, 9.3, 9.4, 9.5, 9.6, 9.7, 9.8, 9.9, or 10 hours), including any and all ranges and subranges therein (e.g., for 10 hours).

In further embodiments, said thermally annealing the Nb—Zr material removes impurities from the Nb—Zr material and shifts binding energy of the material toward metallic positions (e.g., for both Zr and Nb 3p and 3d photoelectrons).

In some embodiments, the invention comprises a particle accelerator comprising SRF cavities, wherein the inner surface has a thickness of 1 nm to 25,000 nm (e.g., 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, or 25000 nm, etc.), including any and all ranges and subranges therein (e.g., 20 to 300 nm), and comprises the Nb—Zr alloy as described.

In further embodiments, the Nb—Zr alloy is present in the form of a film. In further embodiments, the film has a thickness of 1 nm-25,000 nm (e.g., 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, or 25000 nm, etc.), including any and all ranges and subranges therein (e.g., 20 to 300 nm).

In some embodiments, the invention comprises a superconductor-insulator-superconductor tunnel junction (SIS) comprising a first superconductor/electrode, a second superconductor/electrode, and a barrier layer (e.g. an insulating thin film having a thickness of 0.1 nm to 10 nm (e.g., 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, 5.0, 5.1, 5.2, 5.3, 5.4, 5.5, 5.6, 5.7, 5.8, 5.9, 6.0, 6.1, 6.2, 6.3, 6.4, 6.5, 6.6, 6.7, 6.8, 6.9, 7.0, 7.1, 7.2, 7.3, 7.4, 7.5, 7.6, 7.7, 7.8, 7.9, 8.0, 8.1, 8.2, 8.3, 8.4, 8.5, 8.6, 8.7, 8.8, 8.9, 9.0, 9.1, 9.2, 9.3, 9.4, 9.5, 9.6, 9.7, 9.8, 9.9, or 10.0 nm) including any number therein and any subranges therebetween, for example, 0.1 nm to 7 nm, 0.1 nm to 3 nm, etc.) between the first superconductor/electrode and the second superconductor/electrode, wherein the first superconductor/electrode and the second superconductor/electrode comprise the Nb—Zr alloy as described.

In further embodiments, the superconductor-insulator-superconductor tunnel junction as described comprises the first superconductor/electrode is an upper electrode (one electrode on top of another electrode) or a left electrode (one electrode on the side of another electrode), and the second superconductor/electrode is a lower electrode or a right electrode, having a thickness, a width, and/or a length (or at least one dimension) of 1 nm-25,000 nm (e.g., 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, or 25000 nm, etc.) including any number therein and any subranges therebetween.

In further inventive embodiments, a quantum computer or quantum computing device comprises:

i) an SRF cavity or a resonator wherein at least a portion of at least one surface of the SRF cavity or resonator comprises the Nb—Zr alloy;

ii) one or more superconducting qubits comprising an inductor made by a superconductor-insulator-superconductor Josephson junction and a linear capacitor (e.g.

one or more superconductor pads), wherein at least a portion of the superconductor-insulator-superconductor Josephson junction and/or at least a portion of the superconductor pad(s) comprises one or more layers comprising the Nb—Zr alloy;

iii) one or more superconducting memories comprising a superconductor-insulator-superconductor Josephson junction and a ferromagnetic dot, wherein the superconductor-insulator-superconductor Josephson junction comprises a write line and a background line, wherein the write line and/or the background line comprises one or more layers of the Nb—Zr alloy; or iv) one or more superconducting nanowire single-photon detectors (SNSPDS) comprising a plurality of superconducting nanowires arranged in a predetermined pattern, wherein the superconducting nanowires comprise the Nb—Zr alloy.

These and other objects, features, and advantages of this invention will become apparent from the following detailed description of the various aspects of the invention taken in conjunction with the accompanying drawings.

CLAUSES

The following clauses describe certain non-limiting embodiments of the invention.

Clause 1. A niobium-zirconium (Nb—Zr) alloy comprising an ordered body-centered cubic (bcc) β-Nb—Zr phase, wherein the Nb—Zr alloy comprises less than or equal to 50 at. % Zr.

Clause 2. The Nb—Zr alloy according to clause 1, comprising greater than 50 at. % Nb.

Clause 3. The Nb—Zr alloy according to clause 1 or clause 2, comprising 10 to 40 wt. % Zr (e.g., 15 to 27 at. %).

Clause 4. The Nb—Zr alloy according to any one of the preceding clauses, wherein Nb and Zr account for at least 50 at. % of the alloy (e.g., at least 85 at. % of the alloy).

Clause 5. The Nb—Zr alloy, produced under ambient conditions, according to any one of the preceding clauses, having a critical temperature ($T_c$) greater than 9 K.

Clause 6. The Nb—Zr alloy, produced under ambient conditions, according to any one of the preceding clauses, having a $T_c$ of 9-17 K (e.g., 13-16 K).

Clause 7. The Nb—Zr alloy according to any one of the preceding clauses, wherein the Nb—Zr alloy comprises zirconium dioxide ($ZrO_2$).

Clause 8. The Nb—Zr alloy according to clause 7, wherein $ZrO_2$ is the only oxide present in the Nb—Zr alloy.

Clause 9. The Nb—Zr alloy according to any one of the preceding clauses, in the form of a film.

Clause 10. The Nb—Zr alloy according to clause 9, wherein the film has a thickness of 1 to 25,000 nm (e.g., 20 to 300 nm, 20 to 40 nm).

Clause 11. The Nb—Zr alloy according to any one of the preceding clauses, having an increased critical field as compared to Nb.

Clause 12. The Nb—Zr alloy according to any one of the preceding clauses, having reduced BCS resistance as compared to Nb.

Clause 13. The Nb—Zr alloy according to any one of the preceding clauses, comprising less than 0.5 wt % hexagonal Zr phase (e.g., comprising 0 wt % hexagonal Zr phase).

Clause 14. The Nb—Zr alloy according to any one of the preceding clauses, comprising rock-salt NbZrC or NbC.

Clause 15. The Nb—Zr alloy according to any one of the preceding clauses, present at a surface region of an Nb substrate.

Clause 16. The Nb—Zr alloy according to clause 15, wherein the surface region is 1 to 25,000 nm thick.

Clause 17. The Nb—Zr alloy according to clause 15, wherein the surface region is 20 to 300 nm thick.

Clause 18. A superconducting radio-frequency (SRF) surface comprising the Nb—Zr alloy according to any one of the preceding clauses.

Clause 19. The SRF surface according to clause 18, wherein the Nb—Zr alloy is present as a film on the SRF cavity surface.

Clause 20. A method of preparing an ordered Nb—Zr alloy according to any one of the preceding clauses, said method comprising:

performing (a) or (b)

(a) evaporating a zirconium (Zr) target on a niobium (Nb) surface; or (b) electrochemically reacting zirconium tetrafluoride ($ZrF_4$) with the Nb surface; thereby forming a Nb—Zr material; and thermally annealing the Nb—Zr material;

thereby forming the Nb—Zr alloy.

Clause 21. The method according to clause 20, wherein said thermally annealing the Nb—Zr material comprises annealing at 300-1100° C. (e.g., 600-1000° C.) for 1 minute to 1 week (e.g., for 20 minutes to 10 hours).

Clause 22. The method according to clause 20 or clause 21, wherein said thermally annealing the Nb—Zr material is performed under vacuum (e.g., under $10^{-7}$ torr-$10^{-6}$ torr vacuum, e.g., under $2\times10^{-7}$ torr).

Clause 23. The method according to any one of clauses 20-22, comprising:

performing (a):

(a) evaporating (e.g., physical-vapor depositing) a Zr target on a Nb surface; thereby forming a Nb—Zr material;

and further comprising:

subjecting the Nb—Zr material to an acid etch.

Clause 24. The method according to clause 23, wherein said (a) evaporating a Zr target on a Nb surface comprises using e-beam or thermal evaporation of a Zr target on the Nb surface.

Clause 25. The method according to clause 23 or clause 24, wherein said (a) evaporating a Zr target on a Nb surface achieves substitutional Zr doping of the surface, thereby incorporating Zr atoms into a cubic structure of the surface.

Clause 26. The method according to any one of clauses 23-25, wherein comprising, after (a), subjecting the Nb—Zr material to the acid etch, which comprises etching the Nb—Zr material with hydrofluoric acid (HF).

Clause 27. The method according to clause 26, wherein said etching removes hexagonal Zr phase from the Nb—Zr material.

Clause 28. The method according to clause 20, comprising:

performing (b):

(b) electrochemically reacting Zr with the Nb surface; thereby forming a Nb—Zr material.

Clause 29. The method according to clause 28, wherein said (b) electrochemically reacting Zr with the Nb surface comprises electrochemically inducing reaction between the $ZrF_4$ (or other Zr precursor) and Nb, thereby depositing Zr on the Nb surface, thereby forming the Nb—Zr material, which comprises precursor Nb—Zr alloy containing impurities.

Clause 30. The method according to clause 29, wherein said electrochemically depositing Zr on the Nb surface comprises using a three-electrode setup utilizing a platinum (Pt) counter electrode, Nb working electrode, and pseudo reference electrode, employed together.

Clause 31. The method according to any one of clauses 28-30, comprising electrochemically depositing the Zr on the Nb surface for 1 min to 50 hours (e.g., 2 to 10 hours).

Clause 32. The method according to any one of clauses 28-31, wherein said electrochemically depositing the Zr:

is performed in an inert gas environment (e.g., with $O_2$ and $H_2O$ levels below 0.5 ppm); and comprises:

dissolving $ZrF_4$ and LiF in ionic liquids (e.g., 1-butyl-1-methylpyrrolidinium bis(trifluoromethylsulfonyl) imide) (e.g., at different concentrations, for example, 0.48 M-1.24 M $ZrF_4$ and 0.98-4.8 times LiF addition);

heating from 30 to 200° C. (e.g., from 150 to 200° C.); and depositing the Zr while controlling the depositing potential and current via potentiostat (e.g., for 2 to 10 hours);

thereby forming the Nb—Zr material.

Clause 33. The method according to clause 32, comprising, after said electrochemically depositing the Zr, thermally annealing the Nb—Zr material at 300-1100° C. for 20 minutes to 12 hours (e.g., 10 hours).

Clause 34. The method according to clause 31, wherein said thermally annealing the Nb—Zr material removes impurities from the Nb—Zr material and shifts binding energy of the material toward metallic positions (e.g., for both Zr and Nb 3p and 3d photoelectrons).

Clause 35. The method according to any one of clauses 28-34, wherein, the Nb—Zr alloy comprises rock-salt NbZrC or NbC.

Clause 36. A particle accelerator comprising SRF cavities, wherein the inner surface having a thickness of 1 nm to 25,000 nm including any number therein and any subranges therebetween comprises the Nb—Zr alloy according to any one of the clauses 1-17.

Clause 37 The particle accelerator of clause 36, where the Nb—Zr alloy is present in the form of a film having a thickness of 1 nm-25,000 nm including any number therein and any subranges therebetween.

Clause 38 A superconductor-insulator-superconductor tunnel junction (SIS) comprising a first superconductor/electrode, a second superconductor/electrode, and a barrier layer (e.g. an insulating thin film having a thickness of 0.1 nm to 10 nm including any number therein and any subranges therebetween, preferably 0.1 nm-7 nm, or more preferably 0.1 nm-3 nm) between the first superconductor/electrode and the second superconductor/electrode, wherein the first superconductor/electrode and the second superconductor/electrode comprise the Nb—Zr alloy according to any one of the clauses 1-17.

Clause 39. The superconductor-insulator-superconductor tunnel junction of clause 38, wherein the first superconductor/electrode is an upper electrode (one electrode on top of another electrode) or a left electrode (one electrode on the side of another electrode), and the second superconductor/electrode is a lower electrode or a right electrode, having a thickness, a width, and/or a length (or at least one dimension) of 1 nm-25,000 nm including any number therein and any subranges therebetween.

Clause 40. A quantum computer or quantum computing device comprising:

i) a SRF cavity or a resonator wherein at least a portion of at least one surface of the SRF cavity or resonator comprising the Nb—Zr alloy according to any one of the clauses 1-17;

ii) one or more superconducting qubits comprising an inductor made by a superconductor-insulator-superconductor Josephson junction (e.g. an SIS of clause 38) and a linear capacitor (e.g. one or more superconductor pads), wherein at least a portion of the superconductor-insulator-superconductor Josephson junction (e.g. SIS of clause 38) and/or at least a portion of the superconductor pad(s) comprising one or more layers of the Nb—Zr alloy according to any one of the clauses 1-17;

iii) one or more superconducting memories comprising a superconductor-insulator-superconductor Josephson junction (e.g. an SIS of clause 38) and a ferromagnetic dot, wherein the superconductor-insulator-superconductor Josephson junction comprising a write line and a background line, wherein the write line and/or the background line comprising one or more layers of the Nb—Zr alloy according to any one of the clauses 1-17; or iv) one or more superconducting nanowire single-photon detectors (SNSPDS) comprising a plurality of superconducting nanowires arranged in a predetermined pattern, wherein the superconducting nanowires comprising the Nb—Zr alloy according to any one of the clauses 1-17.

EXAMPLES

The invention will now be illustrated, but not limited, by reference to the specific embodiments described in the following examples.

Performance Demonstration of ZrNb Alloys

The superconducting properties and RF performance of different niobium-zirconium (Nb—Zr) surface profiles were measured. Samples were prepared using e-beam evaporation of a Zr target (base pressure: $1.3\times10^{-6}$ torr) on the Nb surface or electrochemical reaction with the Nb surface, followed by thermal annealing under $2\times10^{-7}$ torr vacuum, and a subsequent hydrofluoric acid (HF) etch. The initial film thickness (20-40 nm) and post annealing conditions (600-1000° C. for ⅓-10 h) were varied to modify the surface Zr atomic concentration. As probed by X-ray photoelectron spectroscopy (XPS), observed is 15-27 at. % Zr at the surface of evaporation-based samples (FIG. 1) as well as significant oxygen concentrations. From X-ray diffraction (XRD) (FIG. 2, panel A), it is inferred that substitutional Zr doping was achieved, as evidenced by the doping peaks at lower diffraction angles compared to a Nb cubic reference. Zr's and Nb's bcc lattice parameters are 0.354 nm and 0.330 nm, respectively. Based on Vegard's law, these doping peaks are induced by lattice enlargement when Zr dopants are incorporated into the cubic structure. Moreover, the HF etch entirely eliminates the hexagonal Zr phases that appeared on the outermost region after annealing. Note that the hexagonal α and ω phases have low Tc's of 7 K and 4 K, respectively, so avoiding these hexagonal phases is critical to obtaining high Tc. Additionally, the only oxide detected is $ZrO_2$, which is ideal for SRF applications due to its wide bandgap.

Resistance measurements using a Physical Property Measurement System under the AC transport mode demonstrate a critical temperature (Tc) of up to 13.5 K for evaporation-based samples that were annealed under 600° C. for 10 h. Even more impressively, the flux expulsion measurements indicate that the electrochemically fabricated samples have a higher Tc of 16 K. It is noted that the 13.5 K and 16 K Tc values are significantly higher than the literature-reported 11 K Tc for Nb—Zr bulk alloys and the 7.4 K $T_c$ measured in sputtered Nb—Zr thin films. One can infer that retention of an ordered cubic structure is critical to achieving a higher Tc than random alloys, which matches well with density functional theory simulations.

Figure 2:
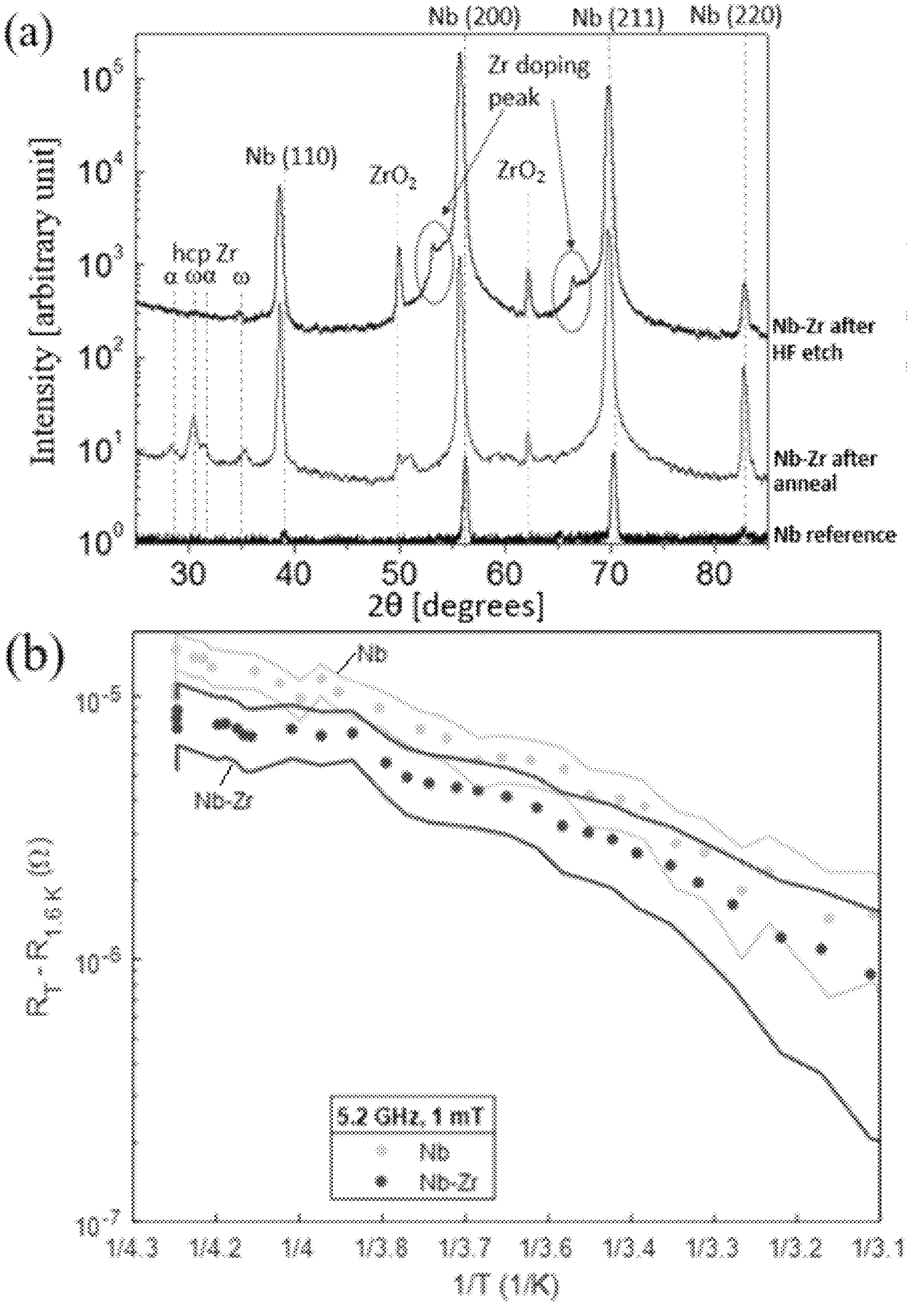
FIG. 2 illustrates structural and superconducting properties of Nb—Zr samples. (a) X-ray diffraction (XRD) pattern for evaporation-based samples annealed at 600° C. for 10 h, with a subsequent hydrofluoric acid (HF) etch. (b) BCS resistance before and after Nb—Zr alloying.

To assess the use of Nb—Zr alloys for SRF accelerator applications, an electrochemical method to scale up the alloying process to be compatible with the Cornell sample test cavity was employed. Indeed, as shown in FIG. 2, panel b, after Nb—Zr alloying, the 5.2 GHz low-field BCS surface resistance is trending lower, which is consistent with the expected benefit of the high $T_c$ of the Nb—Zr material. This first RF demonstration of Nb—Zr alloys establishes a new direction for SRF cavities with high $T_c$ and low surface resistance.

Material Study Using Electrochemical Deposition

Figure 3:
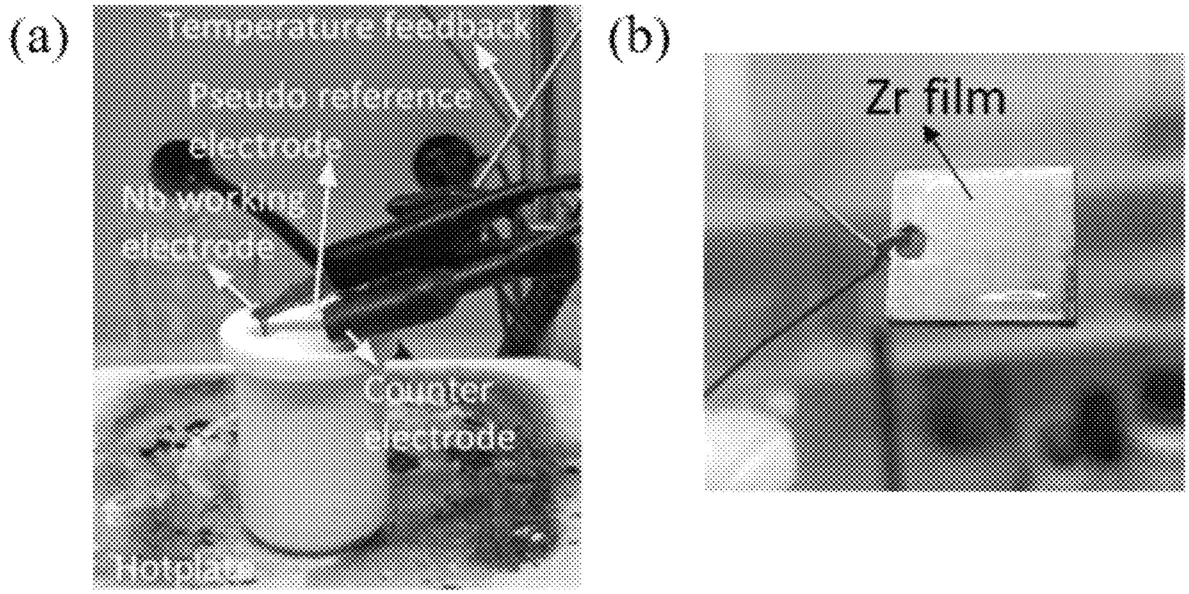
FIG. 3 shows (a) the three-electrode setup for Zr electrochemical deposition presented herein and (b) the electrochemically fabricated Zr film on a Nb surface.

FIG. 3, panel B shows the ZrNb sample image taken immediately after a 4 h electrochemical reaction in the inert-gas glove box. The Zr deposition was found to be able to induce reaction between Zr precursor and Nb surface. As evidenced by XPS, in FIG. 4, ZrNb alloys are formed after the reaction. Such Zr reduction is confirmed by cyclic voltammetry. However, both XPS and energy-dispersive X-ray spectroscopy (EDS) showed the presence of unwanted impurities partially induced during the deposition.

Figure 4:
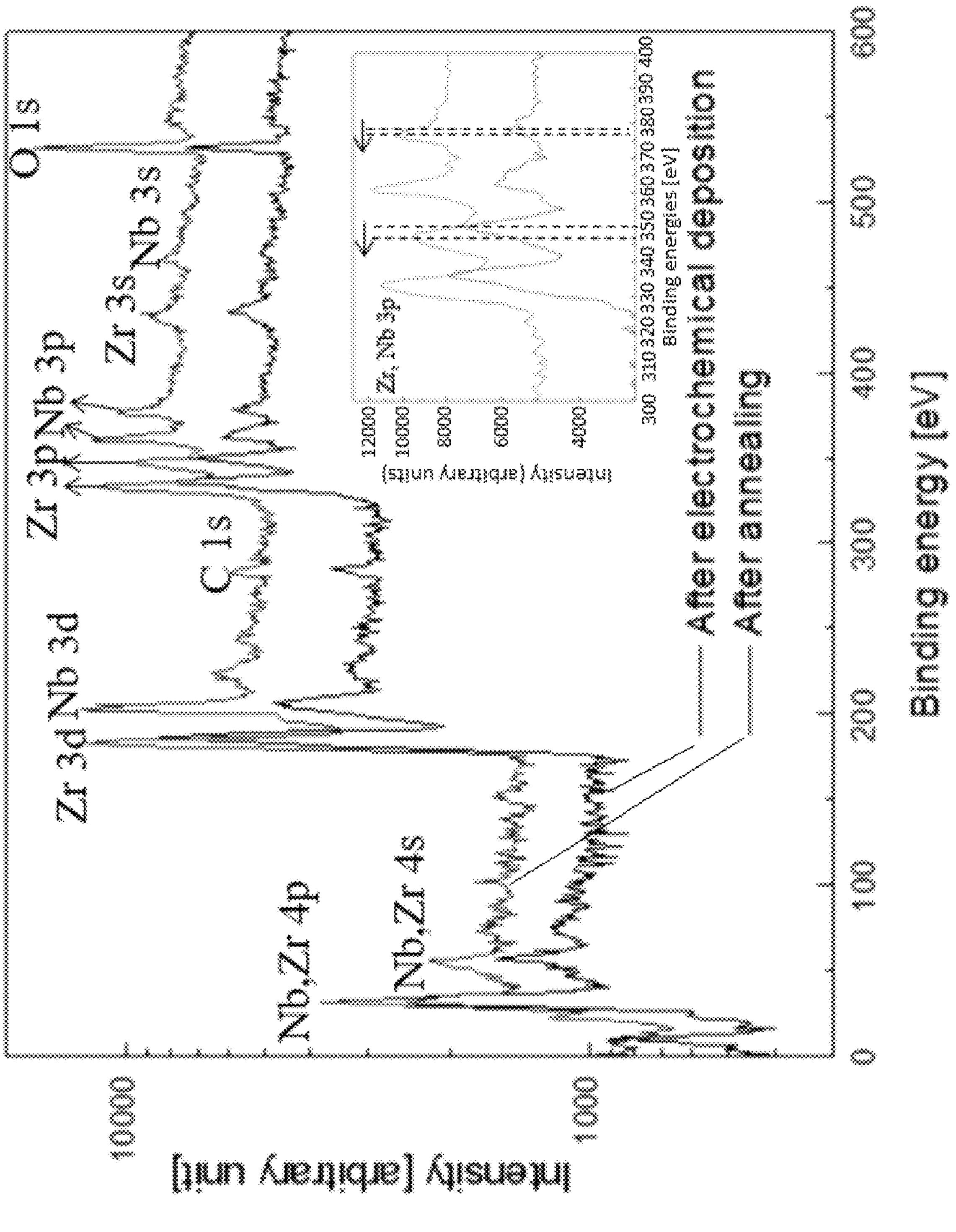
FIG. 4 shows X-ray photoelectron spectra after electrochemical deposition and after thermal annealing, showing the formation of ZrNb alloys.

After thermal annealing, as shown in FIG. 4, the binding energy is observed shifting toward the metallic positions, e.g., for both Zr and Nb 3p photoelectrons. This behavior accompanied the disappearance of the impurities that are responsible for no observation of superconducting transition in as-deposited samples. By contrast, oxygen and carbon intensities are significant. It was noticed that oxygen atoms merely exist in a wide-bandgap zirconium dioxide which works well with SRF applications.

Locking an ordered, cubic crystal phase is essential in this work. XRD data show either diffraction peaks or peak shoulders that appear next to the bcc Nb diffractions. This is clear evidence for ZrNb cubic shifting that obeys the Vegard's law. The shifting is led by a larger lattice parameter of bcc Zr (0.354 nm) than Nb. The unwanted hexagonal Zr phases that are stable under an equilibrium processing condition but result in low Tc values were avoided.

Resistance measurements using a Physical Property Measurement System show a 13 K superconducting transition for thick ZrNb films that were produced by large electrochemical current density, whereas flux expulsion measurements suggest an even higher Tc, 16 K, on a cavity-scale test using a thinner film.

RF Evaluation of a ZrNb SRF Cavity

Figure 5:
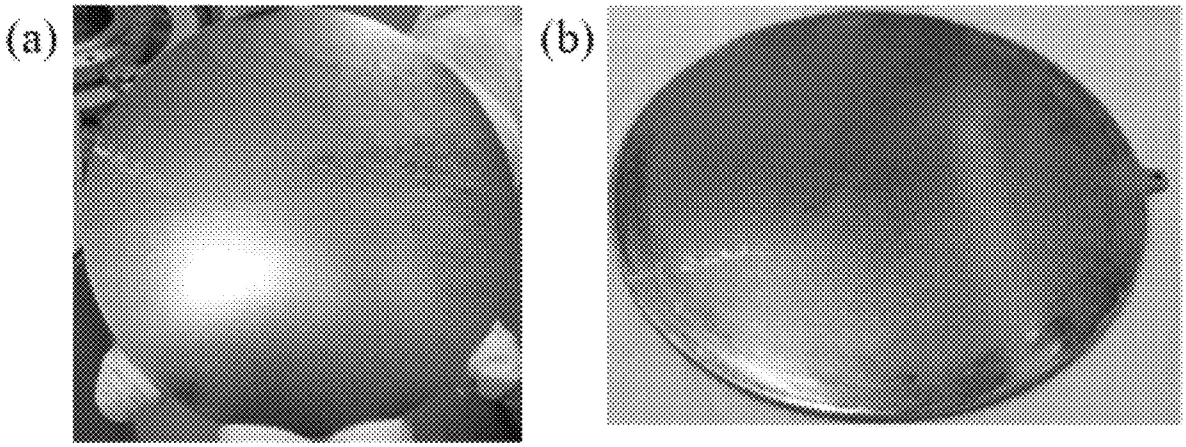
FIG. 5 depicts the scaling up of the electrochemical process to sample test cavity, showing the host plate (a) before Zr deposition and (b) after ZrNb surface alloying.

FIG. 5 shows the scaling up results of electrochemical deposition on a test plate in the Cornell TE-mode sample test cavity. Before Zr deposition, in FIG. 5, panel A, the film host plate was baked at 800° C. and 5 μm electropolished. Slight color contrast on the plate surface after ZrNb alloying was observed (FIG. 5, panel B). During the cavity plate deposition, cyclic voltammetry results matched with the sample-scale study. The same chemical ratio and reduction potential were used, while it was noticed that the current density was 6.35 times smaller than that used for sample study under the same condition. This is likely due to the current limitation from thin electrodes used. The RF performance was measured of both baseline (FIG. 5, panel A) and ZrNb-alloyed (FIG. 5, panel B) plates under 4 GHz and 5.2 GHz frequencies. In order to examine some uncontrolled influences from the initial surface, e.g., the scratch on the plate edge, results from previous baseline tests in the data analysis were included.

Figure 6:
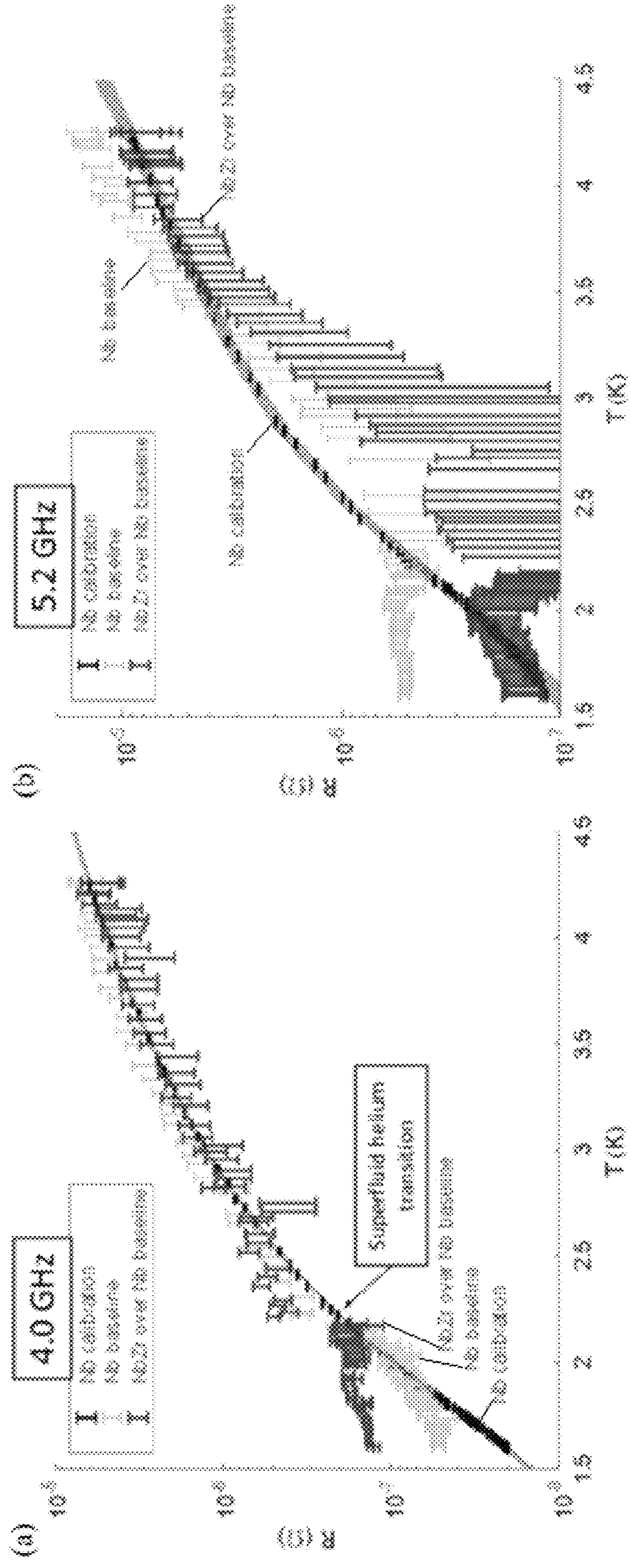
FIG. 6 depicts plots showing the temperature dependent surface resistance measured at (a) 4.0 GHz and (b) 5.2 GHz.

Surface resistance versus temperature curves (FIG. 6) taken under a low field of 1 mT revealed a reduction of BCS resistance after ZrNb alloying. Baseline results roughly match with previous calibration data, but high residual resistance on the baseline plate was observed. When comparing ZrNb results with the baselines ZrNb alloys were found to trend lower than the baseline at the high temperatures ranging from 2 K to 4 K. This trend is especially obvious under a 5.2 GHz RF condition. Moreover, the low temperature (<2 K) results are unusual. ZrNb was observed to reduce residual resistance toward previous calibration values for 5.2 GHz measurements, while the alloy adds significant residual at 4 GHz measurements.

Results from Physical Vapor Deposited Samples

In this work, the formation of a bcc β-ZrNb phase that overcomes equilibrium constraints is surprisingly obtained. Embodiments of the ZrNb alloys synthesized through two methods yield the highest-ever $T_c$ (13-16~K) for this material system under ambient conditions. The $T_c$ values were verified by both resistance measurements and flux expulsion tests. In addition, the electrochemical deposition of Zr films on a Nb surface is novel and practical. Owing to the excellent material and superconducting properties of embodiments of the inventive ZrNb alloys, the RF performance was evaluated using the Cornell SRF sample test cavity. This proof-of-concept RF result marks a viable direction using ZrNb surface alloying to approach the goals of high-energy, high-operation-temperature SRF accelerating cavities. This ZrNb alloy can also be used for other superconducting applications, especially the emerging superconducting quantum computer.

Figure 7:
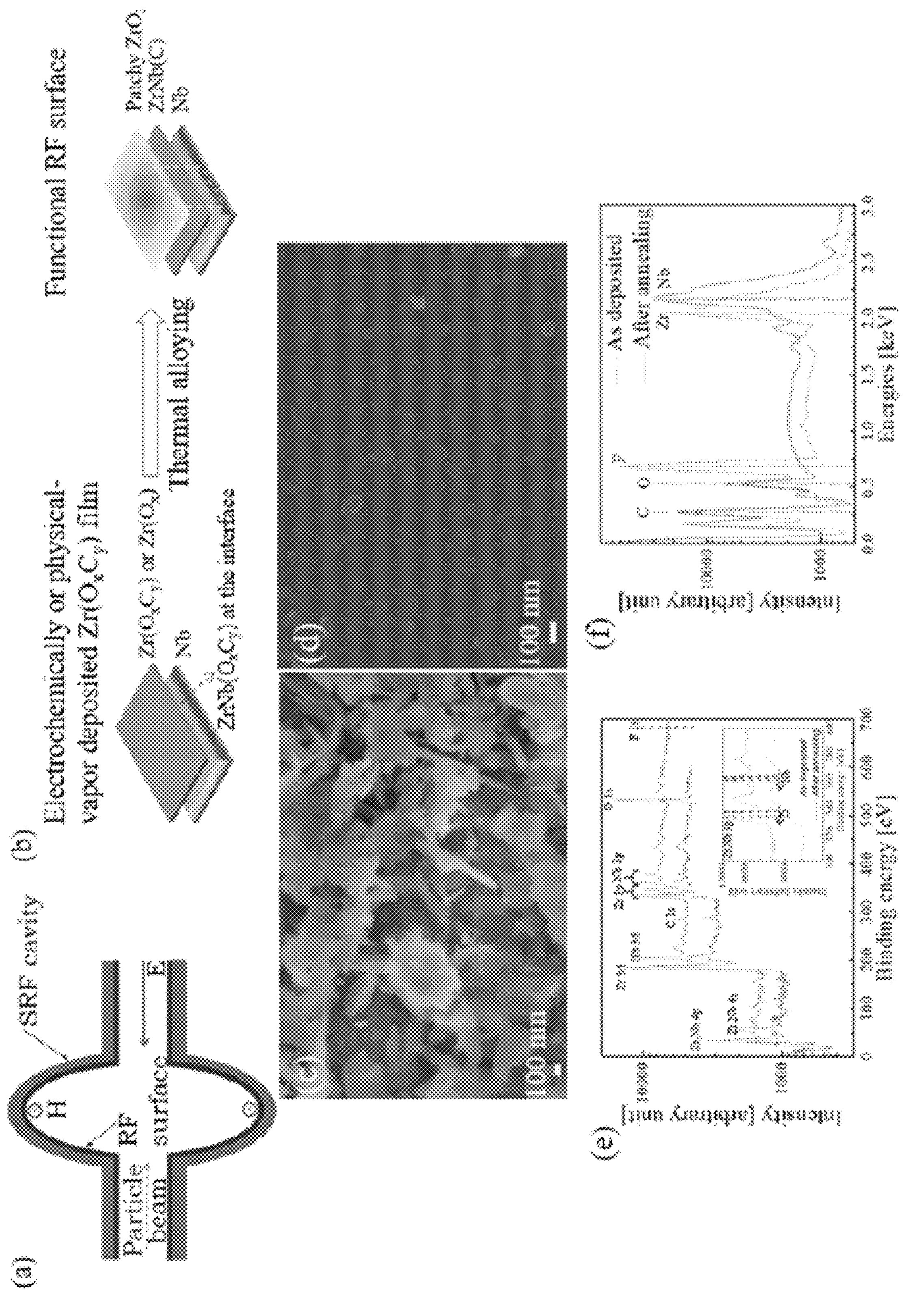
FIG. 7 illustrates the ZrNb alloying via electrochemical (or physical-vapor) deposition and thermal annealing to enable functional superconducting radio-frequency (SRF) surfaces. (a) SRF cavity and surface. (b) Schematic showing the alloying process. c,d|Surface scanning electron microscope (SEM) images of as-deposited (c) and annealed (d) samples for 10 h electrochemical deposition. e,f|X-ray photoelectron spectroscopy (XPS) spectra taken after 40 nm of sputtering (f) and surface energy-dispersive X-ray spectroscopy (EDS) spectra (g) on samples as deposited versus thermally annealed.

FIG. 7, panel B illustrates the electrochemical (or physical vapor) deposition and thermal alloying to make ordered, cubic β-ZrNb on a Nb surface. One application of this invention is to coat the inner surface of an SRF particle accelerator as shown in FIG. 7, panel A. This process was demonstrated on 1 $cm^2$ sample-scale studies and on the Cornell SRF sample test cavity (a 5-inch diameter plate).

Figure 8:
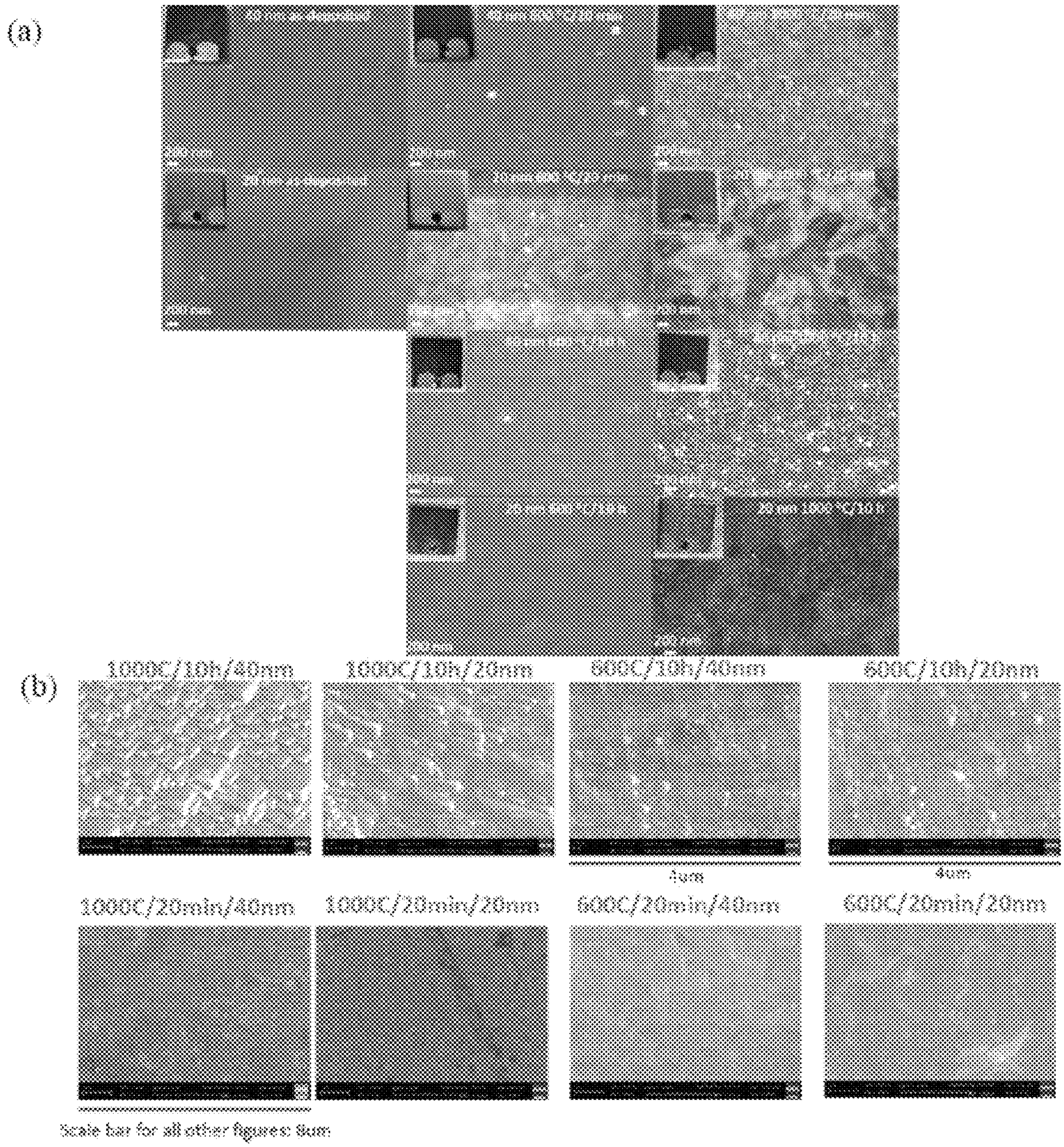
FIG. 8 depicts SEM surface morphology (a) after thermal annealing (600-1000° C. for 20 min-10 h) of the evaporated Zr films (20-40 nm) on the Nb surface; and (b) after HF etch.

FIG. 8, panel A shows the surface morphology taken by scanning electron microscope (SEM) after thermal annealing of the evaporated Zr films on the 1 $cm^2$ Nb samples. The surfaces were readily oxidized showing dielectric colors. Therefore, a subsequent hydrofluoric acid (HF) etch is critical to remove the surface oxides. FIG. 8, panel B shows the surface morphology after HF etch. The disappearance of these oxide grains was observed while observing some facets induced by etching.

Figure 9:
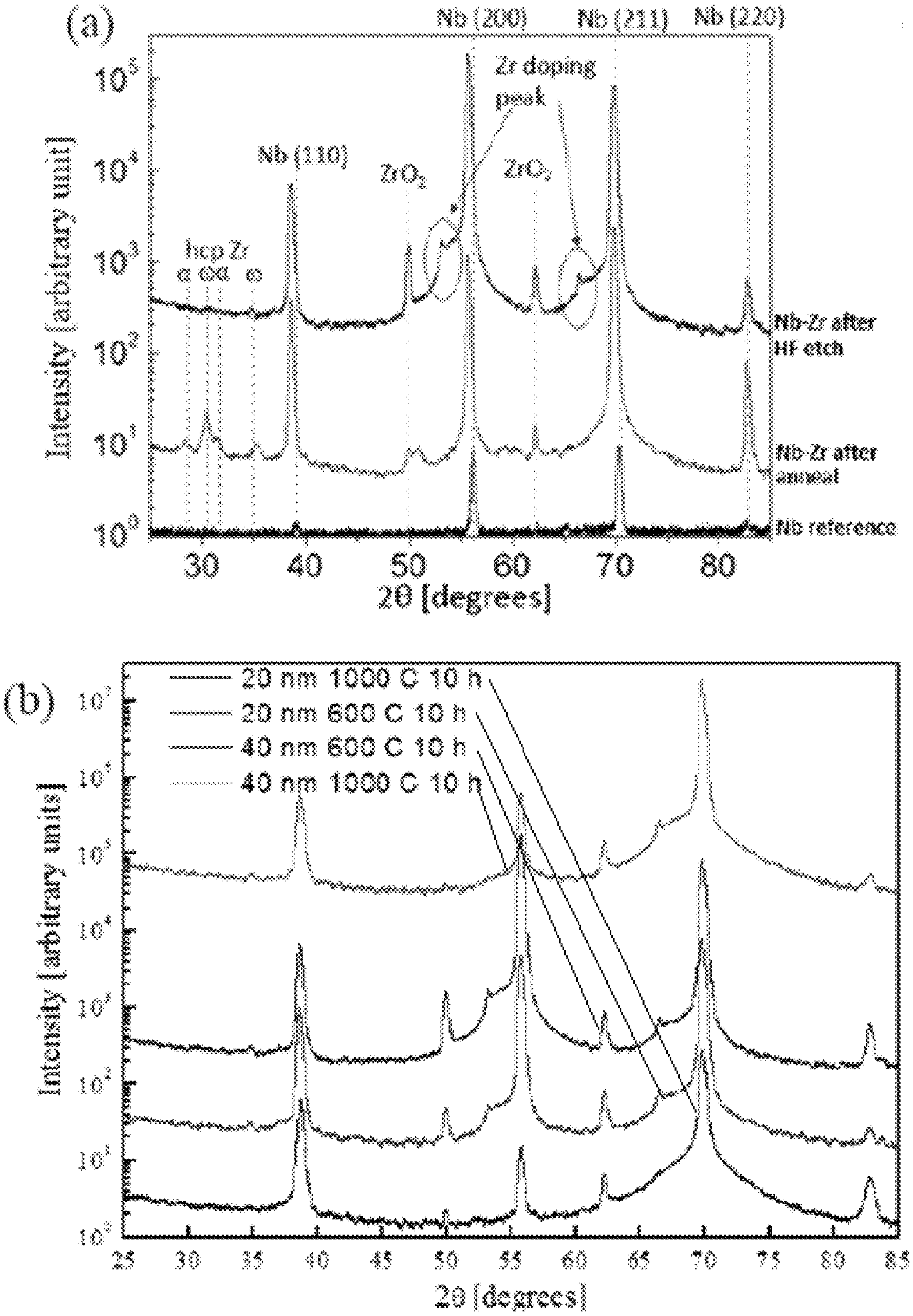
FIG. 9 depicts the XRD patterns (a) after thermal anneal and after HF etch, together with the Nb reference, in which the sample is 40 nm initial film with 600° C. anneal for 10 h and (b) of samples that show high critical temperature ($T_c$) after HF etch.
Figure 10:
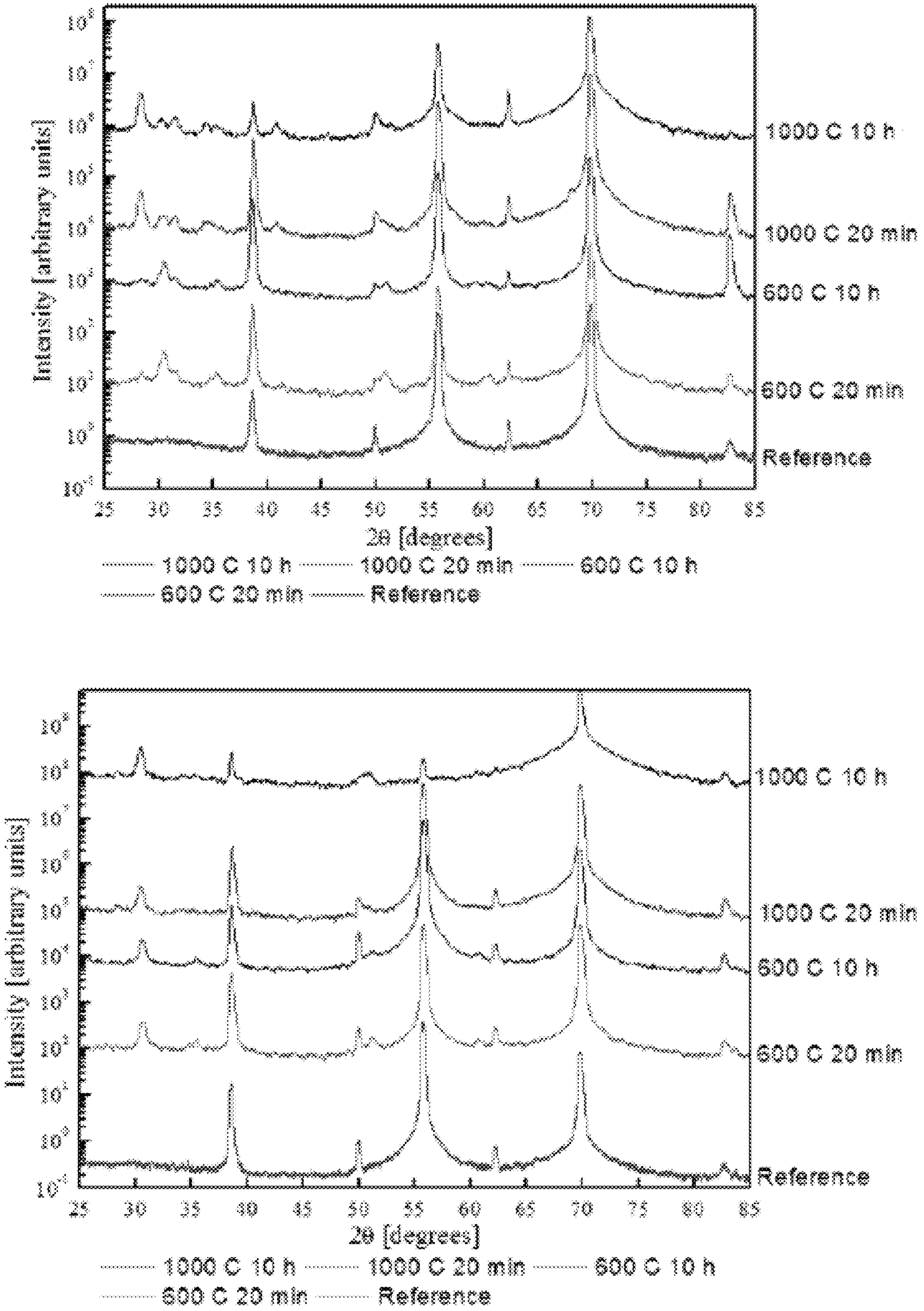
FIG. 10 depicts the XRD pattern for evaporated samples of (a) 40 nm and (b) 20 nm initial films after annealing under different conditions.

Phase identification is critical in this work. High resolution XRD was used to characterize the crystal phase of the samples. FIG. 9, panel A shows substitutional Zr doping was achieved in the Nb lattice forming cubic β-ZrN alloys, as evidenced by the doping peaks at lower diffraction angles compared to a Nb cubic reference. Zr's and Nb's bcc lattice parameters are 0.354 nm and 0.330 nm, respectively. Based on Vegard's law, these doping peaks are induced by lattice enlargement when Zr dopants are incorporated into the cubic structure. Moreover, the HF etch eliminates the hexagonal Zr phases that appeared on the outermost region after annealing. These behaviors are also observed in other annealing conditions that produce high $T_c$ as shown in FIG. 9, panel B. XRD patterns of all samples before HF etch are given in FIG. 10, panels A and B.

Figure 11:
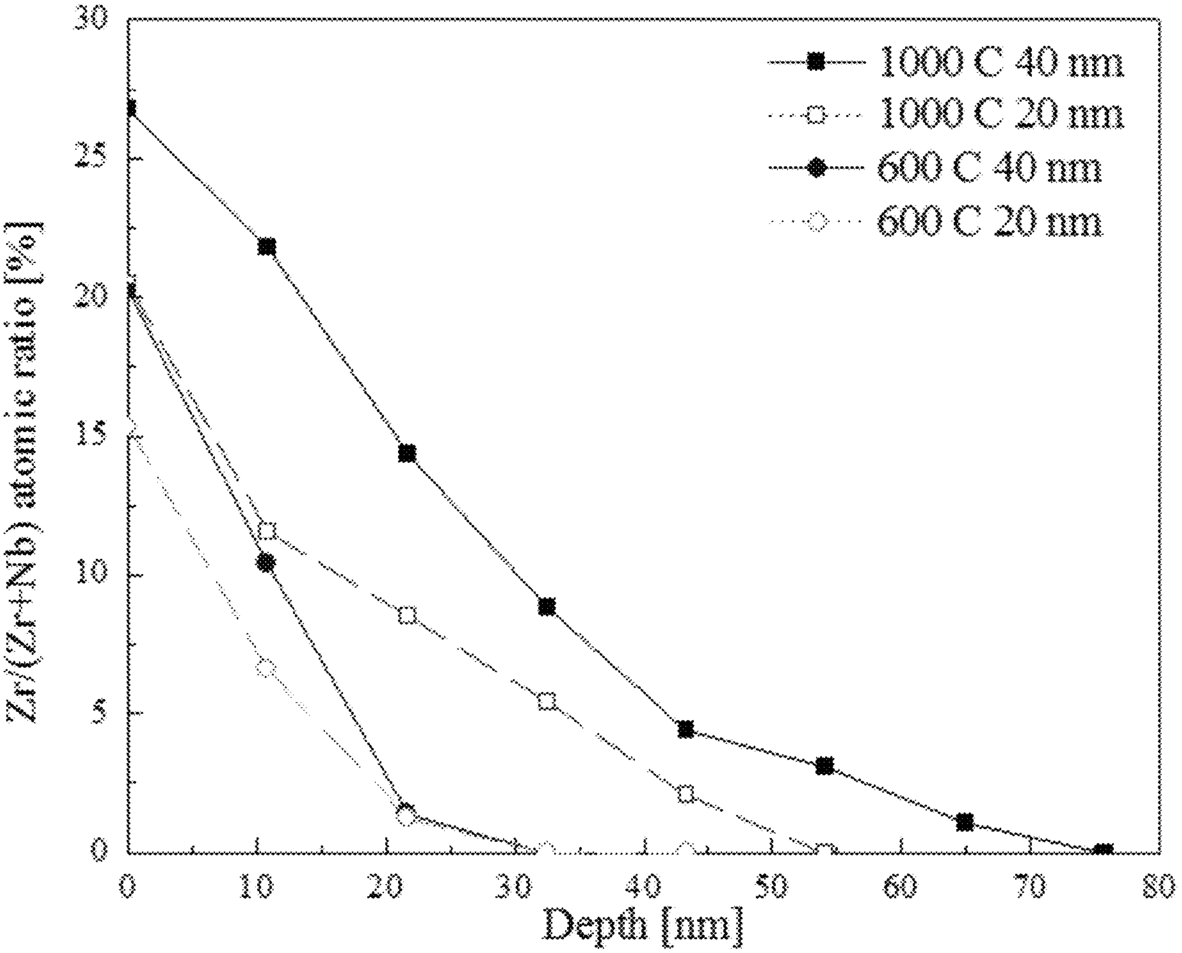
FIG. 11 is a plot illustrating the Zr doping profiles after HF etch.
Figure 12:
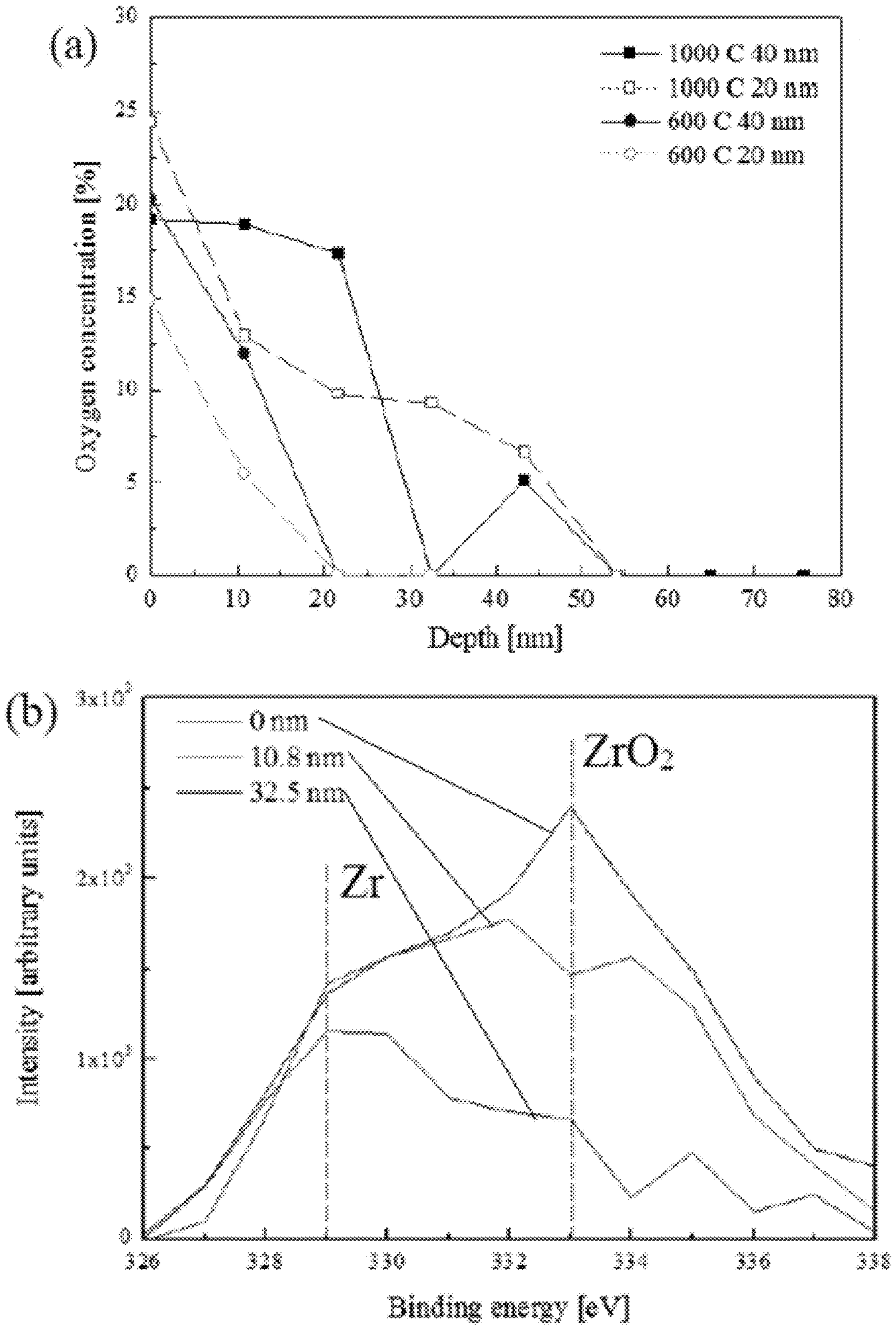
FIG. 12 is a plot showing (a) oxygen (O) atomic concentration profiles after HF etch; (b) XPS spectra taken at different depth for the 1000° C., 10 h annealed 40 nm sample.

Zr doping concentration is another critical parameter that affects $T_c$. XPS was used to measure elemental concentration. Theoretical simulation shows the highest $T_c$ value is observed at ~25 at. % Zr. In this experimental work, 15-27 at. % Zr was achieved as shown in FIG. 11. Oxygen is the only impurity observed in the evaporation-based samples, and the concentration profiles are given in FIG. 12, panel A.

XPS spectra (FIG. 12, panel B) show that the oxygen atoms are fully bonded to Zr generating the insulating $ZrO_2$. The insulating phase does not affect the RF superconducting applications.

Figure 13:
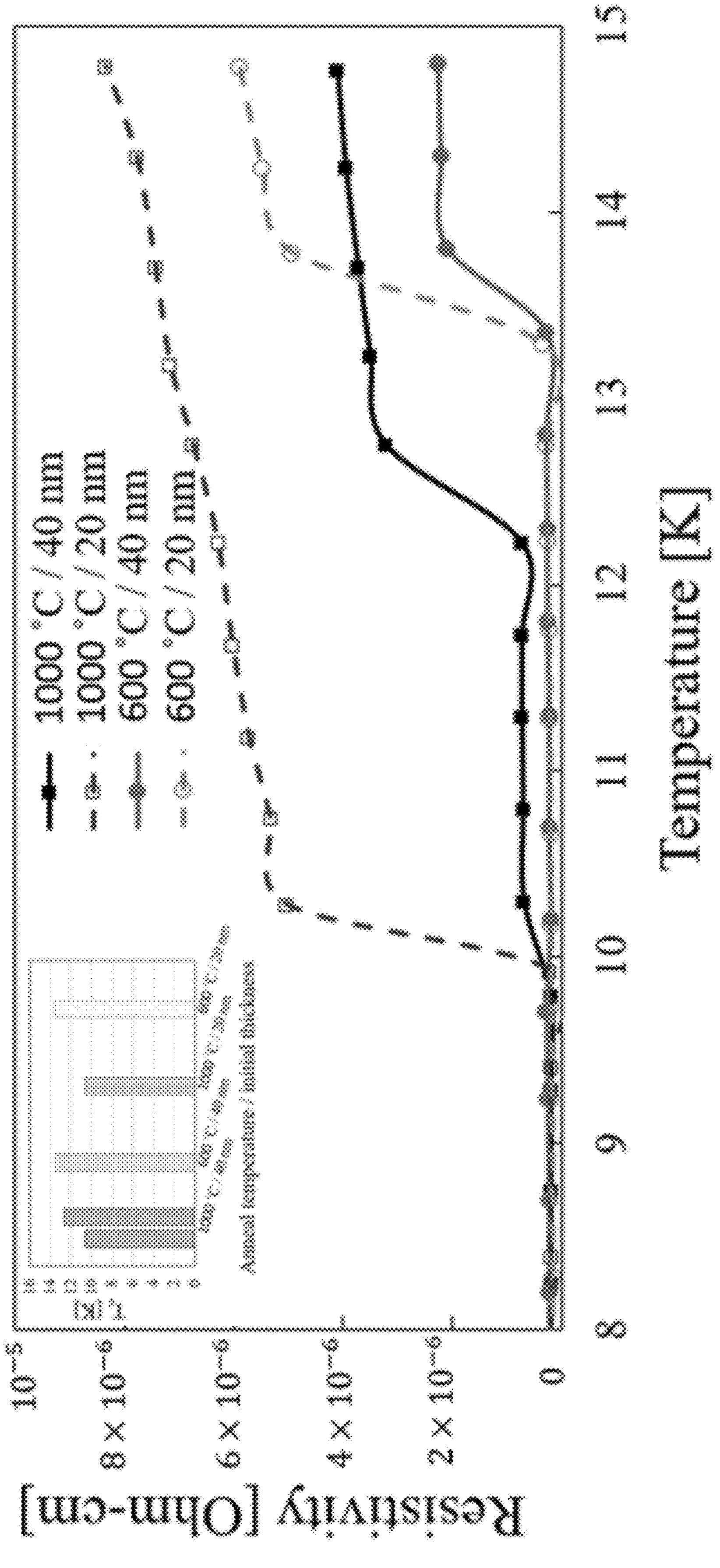
FIG. 13 is a plot illustrating resistivity versus temperature curves showing the Tc. Insert summarizes the Tc values obtained under different conditions.

The critical temperatures were measured using a Physical Property Measurement System under the AC transport mode. As shown in FIG. 13, a Tc of up to 13.5 K was demonstrated for evaporation-based samples that were annealed under 600° C. for 10 h. By contrast, the high temperature (1000° C.) annealed samples show the typical ~10 K $T_c$ that is close to the values from random alloys. The HF etch completely removed the relatively thin films for the 20 min annealed samples, and these samples showed 9 K $T_c$ which is the substrate Nb $T_c$.

Results from Electrochemically Synthesized Samples

Figure 14:
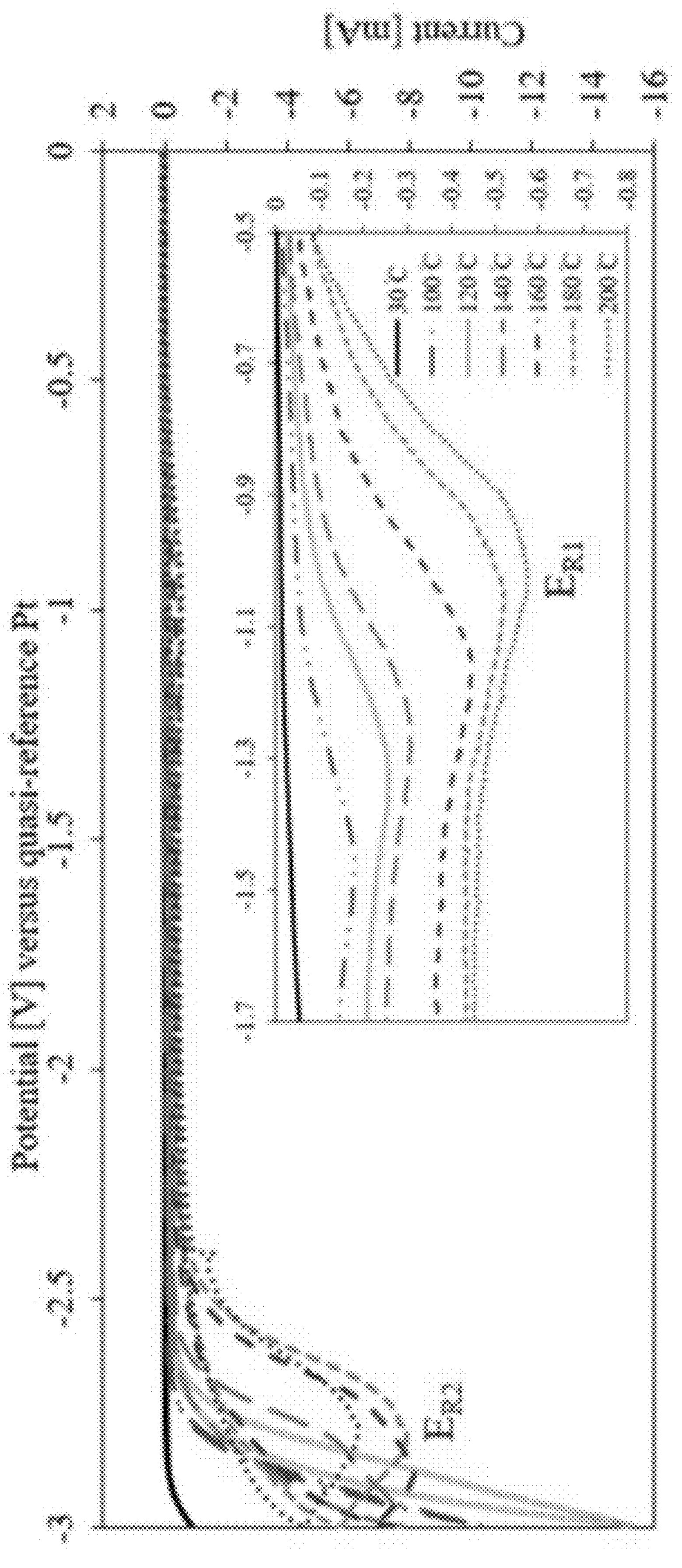
FIG. 14 depicts CV curves under different temperatures, showing the reduction potentials.
Figure 15:
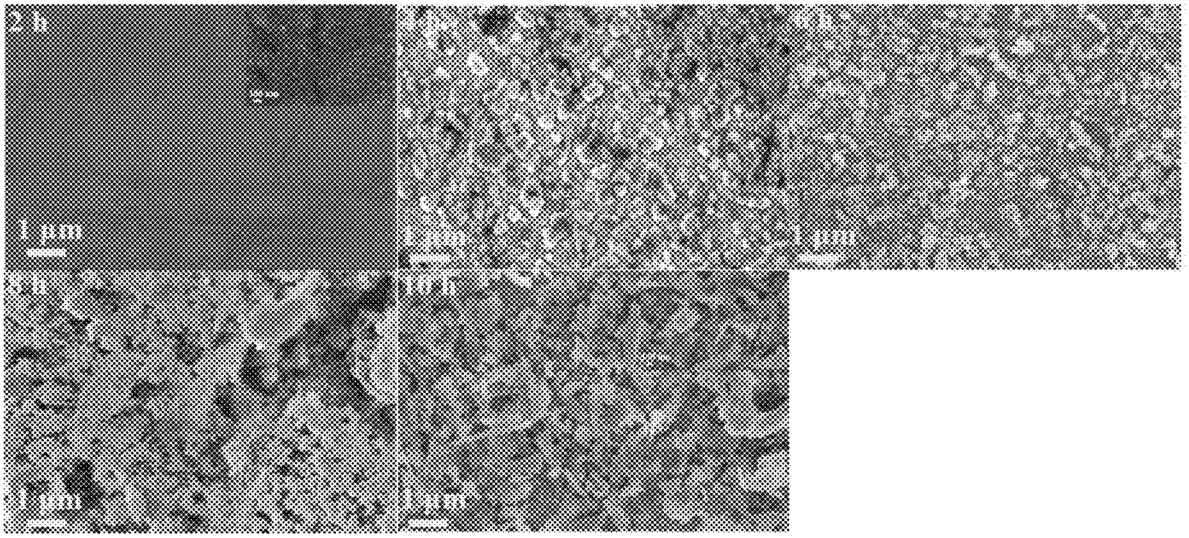
FIG. 15 shows SEM surface morphology after electrochemical deposition with varied time.

A novel Zr electrochemical recipe for deposition on a Nb surface was developed using cyclic voltammetries (CV). FIG. 14 shows two reduction peaks and their evolution as a function of deposition temperature. After optimization, focus was placed on the $E_{R1}$ reduction under >170° C. FIG. 15 shows the surface morphology of films deposited under different durations.

Figure 16:
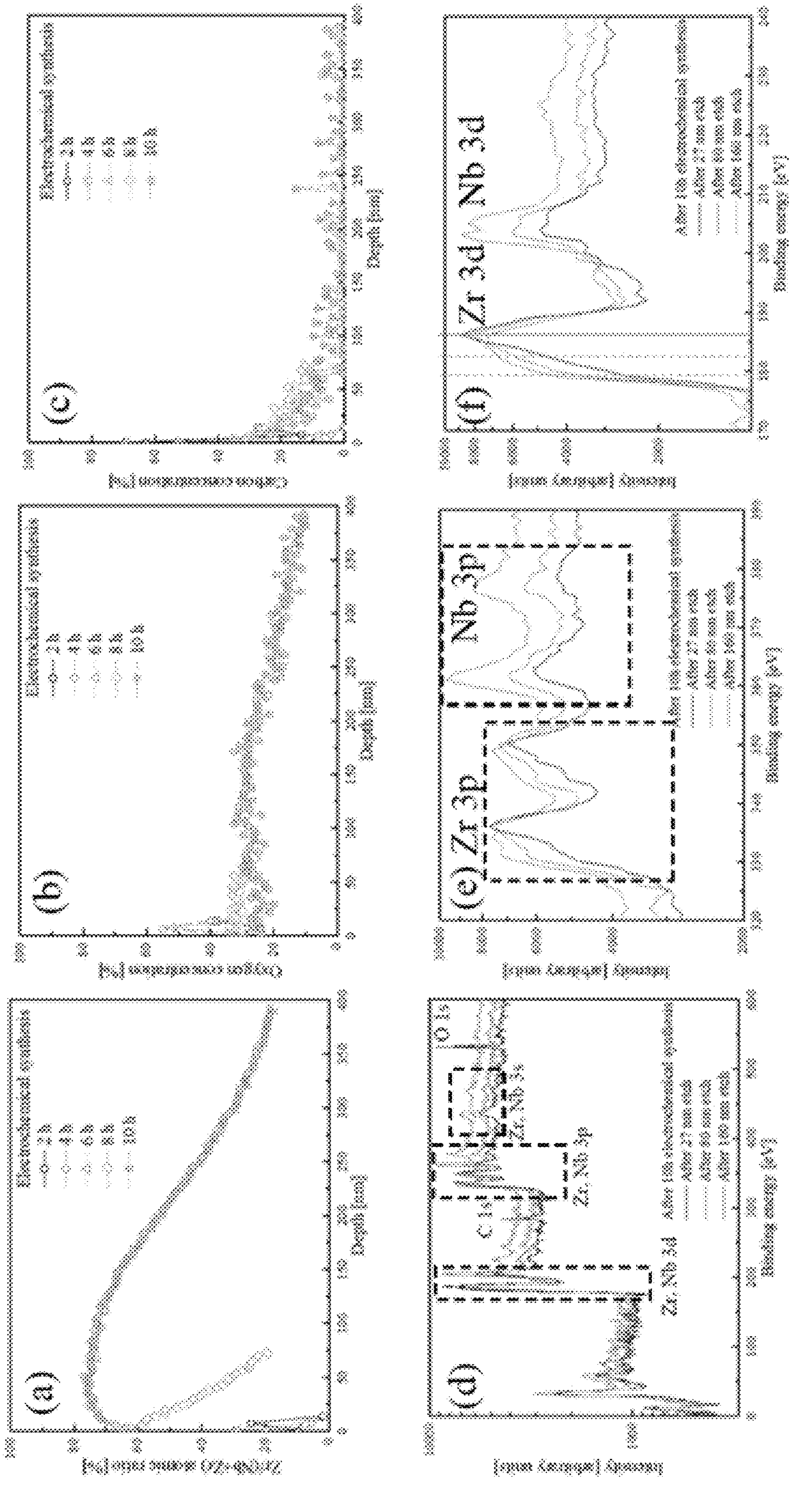
FIG. 16 are plots depicting (a) Zr, (b) O, and (c) carbon (C) depth profiles probed by XPS for samples obtained under different deposition time; (d) XPS spectra taken at different depth for the 10 h deposited sample, and close inspection at (e) 3p and (f) 3d binding energies.
Figure 17:
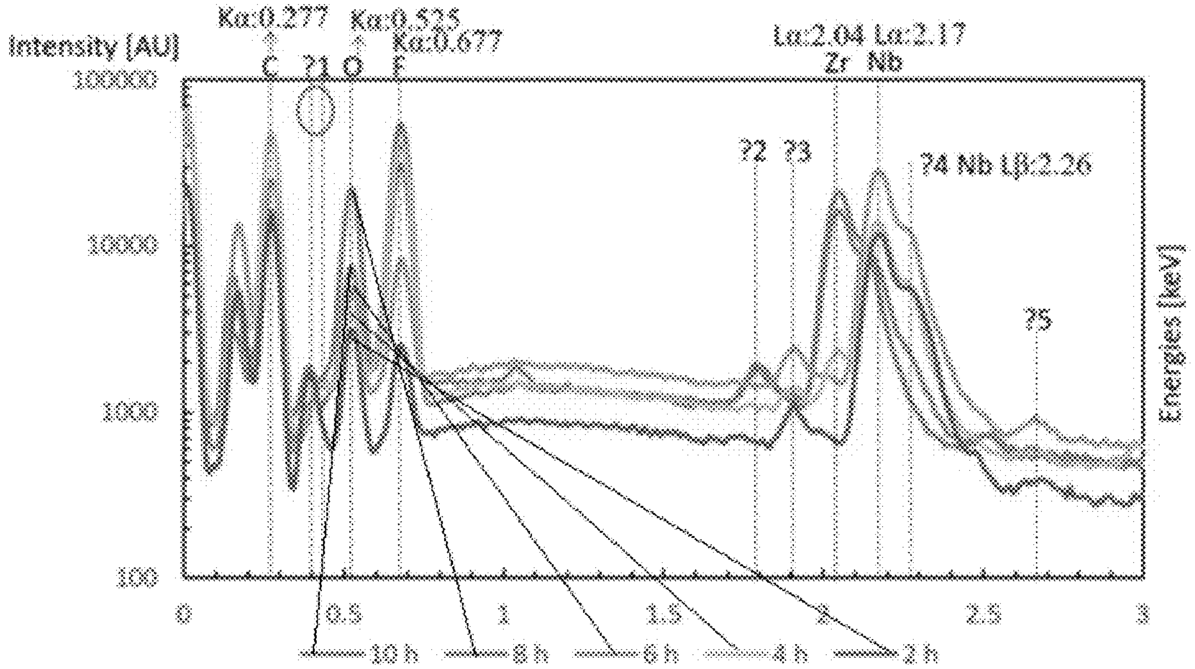
FIG. 17 shows EDS spectra for samples obtained under different deposition times.

Elemental information of samples after 2-10 h deposition is shown in FIGS. 16 and 17. Substantial growth of Zr films is observed after 8 h deposition (FIG. 16, panel A). Different from evaporation-based samples, oxygen (FIG. 16, panel B), carbon (FIG. 16, panel C), and fluorine (FIG. 17) were found in the as-deposited films. Oxygen atoms form the insulating $ZrO_2$, while carbon creates a rock-salt ZrC template that later guides the formation of rock-salt ZrNbC during thermal annealing. XPS spectra (FIG. 16, panels D-F) confirm the mixture of metallic ZrNb, ZrC, and $ZrO_2$.

Figure 18:
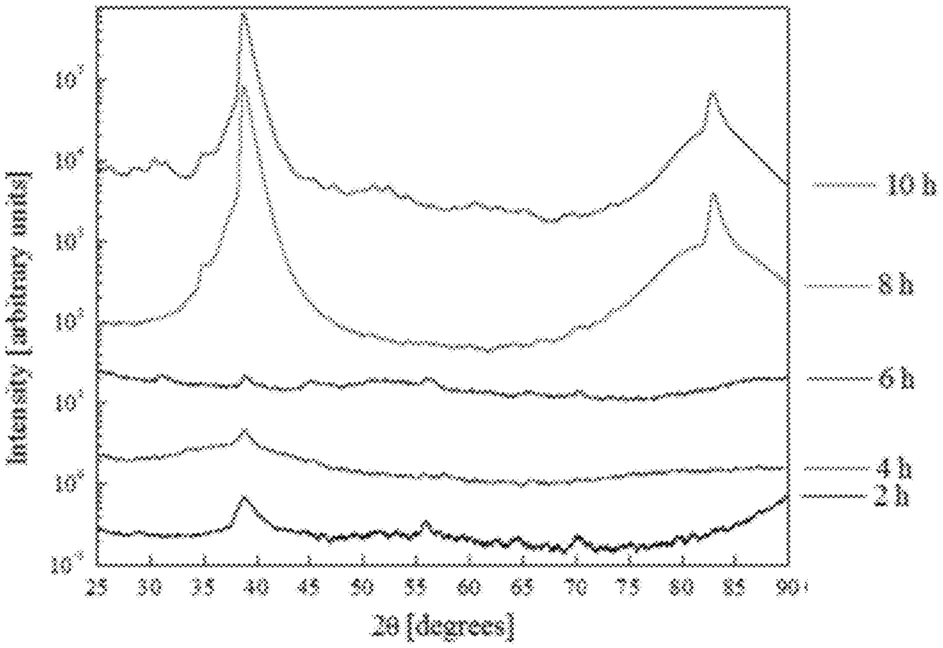
FIG. 18 depicts XRD patterns for samples obtained under different deposition times.

FIG. 18 shows the XRD patterns of the as-deposited samples. The doping shoulders at the lower angles compared to Nb diffractions indicate the Zr doping in Nb. The doping shoulders are essentially obvious for the 8 h and 10 h deposited samples that have thicker films.

Figure 19:
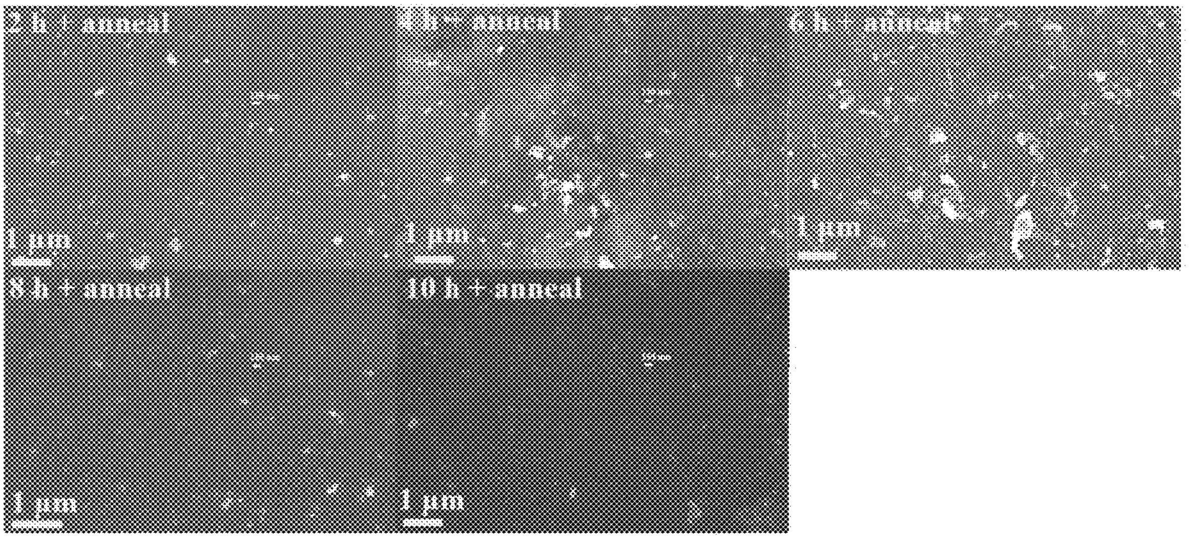
FIG. 19 shows SEM surface morphology after thermal annealing.

After electrochemical synthesis, the samples were thermally annealed under 600° C. for 10 h. FIG. 19 shows the surface morphology of all annealed samples. Along with the film densification, nanometer-sized grains were observed.

Comparing the XPS and EDS spectra before and after annealing of the 10 h deposited sample (FIG. 7, panels E and F), the disappearance of fluorine impurities and XPS peak shifting toward metallic ZrNb, yielding the high $T_c$, were confirmed.

Figure 20:
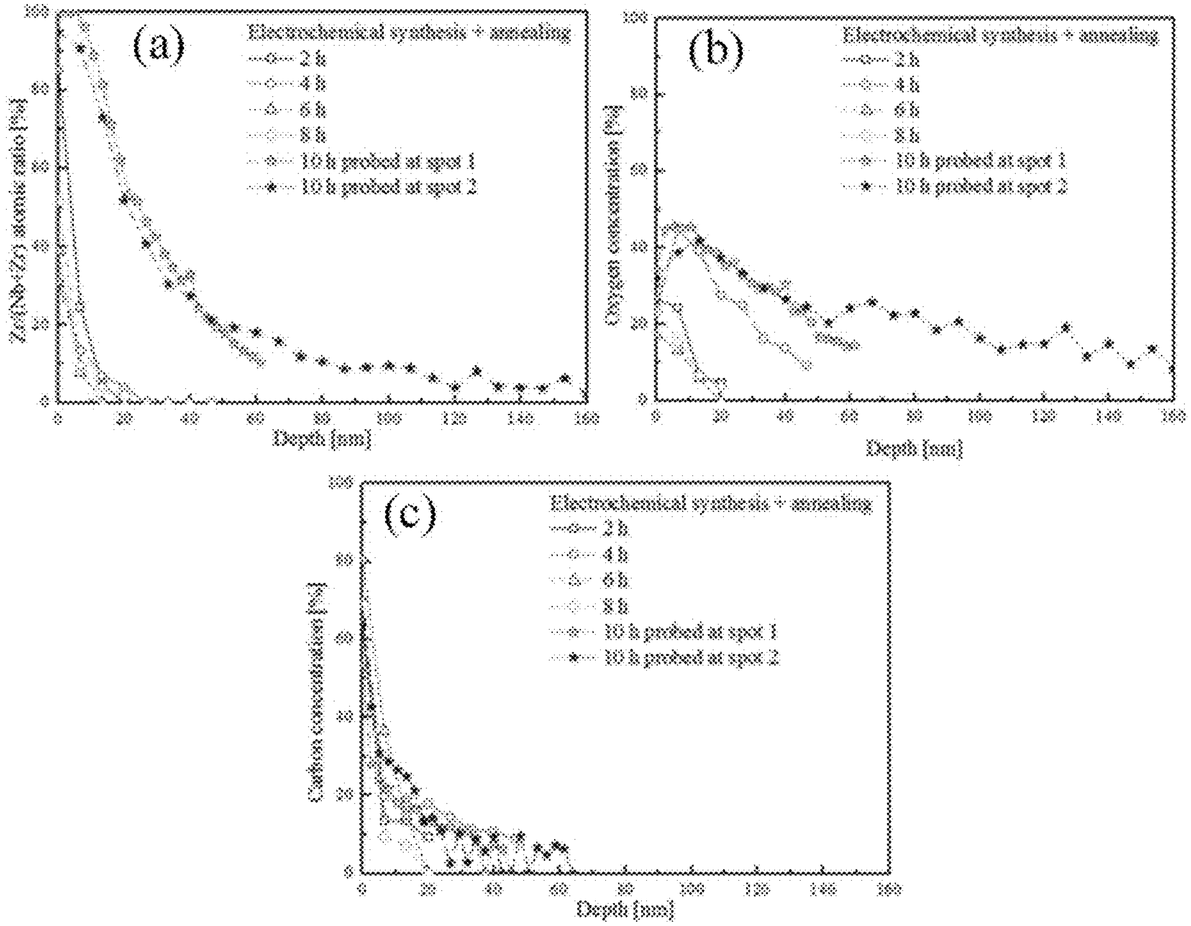
FIG. 20 are plots depicting (a) Zr, (b) O, and (c) C depth profiles probed by XPS after annealing.
Figure 21:
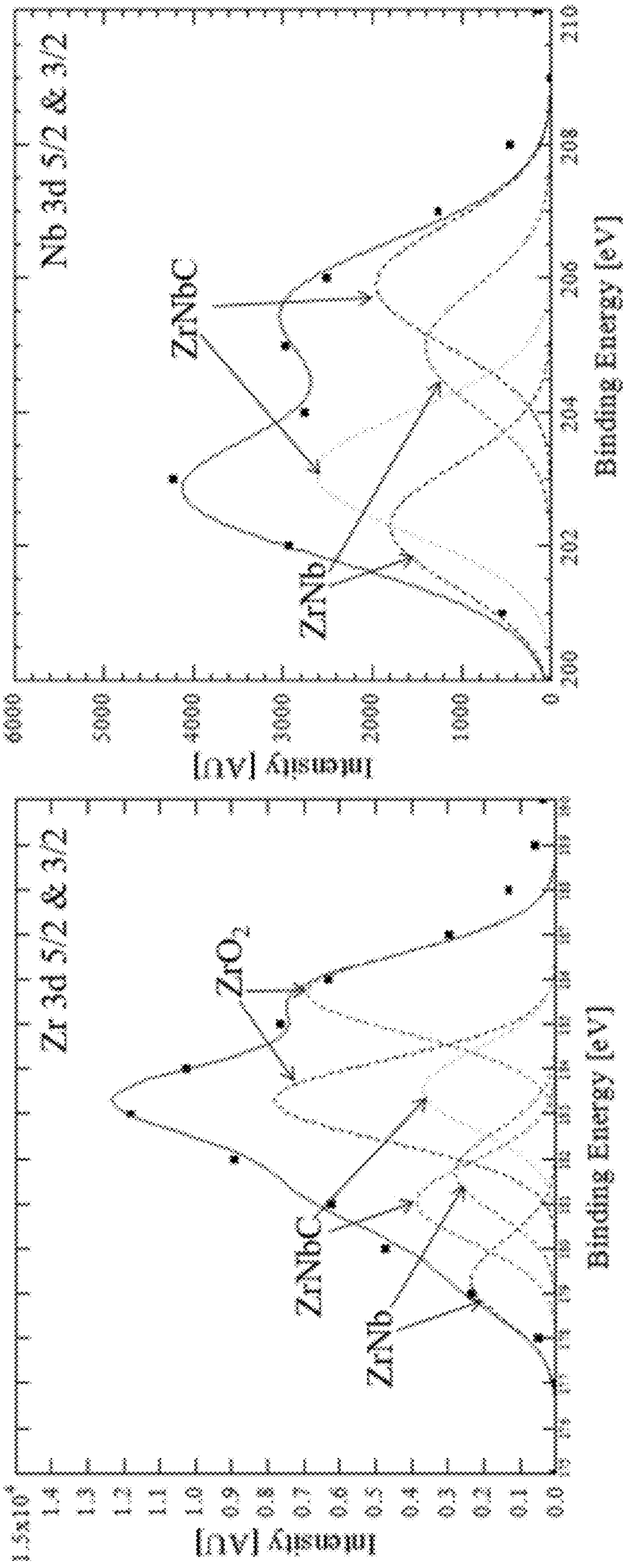
FIG. 21 shows decomposition of different motifs in the 10 h deposited sample.
Figure 22:
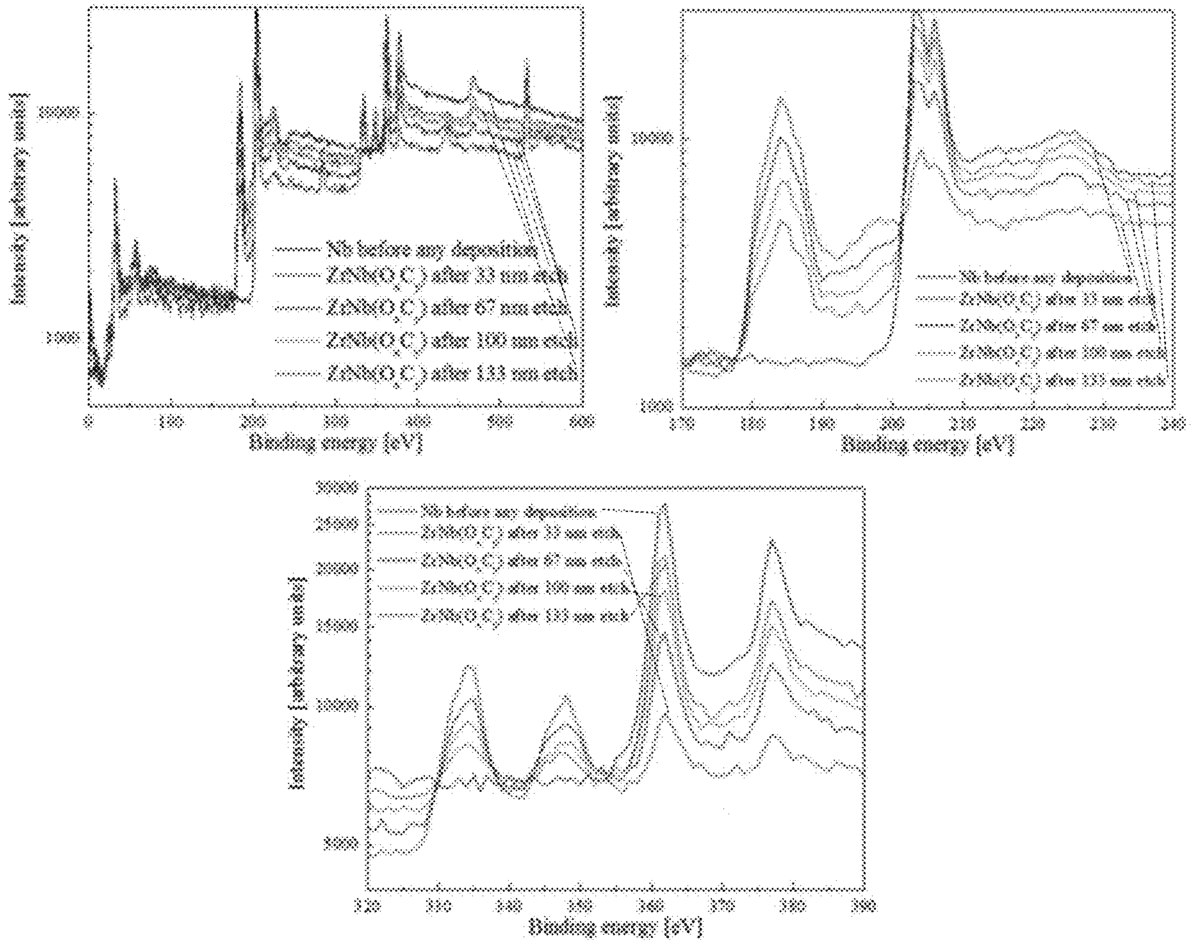
FIG. 22 shows (upper left) XPS spectra taken at different depth for the 10 h deposited sample after thermal annealing, and close inspection at (upper right) 3p and (bottom) 3d binding energies.

Oxygen prevails in the thermally annealed film (FIG. 20, panel B), while carbon accumulates at the 20 nm surface (FIG. 20, panel C). FIG. 21 shows the decomposition of different motifs existing in the samples deposited for 10 h and subsequently annealed. Clearly, $ZrO_2$ is the only oxide formed avoiding the complex niobium oxides. Both metallic (β-ZrNb) and carbide (rocksalt ZrNbC) could be the active phases determining the $T_c$. Further, the XPS spectra taken at different depth, as shown in FIG. 22, barely show variation throughout the film.

Combining the diffraction and XPS results, it is confirmed that the material system consists of metallic β-ZrNb and rocksalt ZrNbC (in addition to $ZrO_2$).

Figure 23:
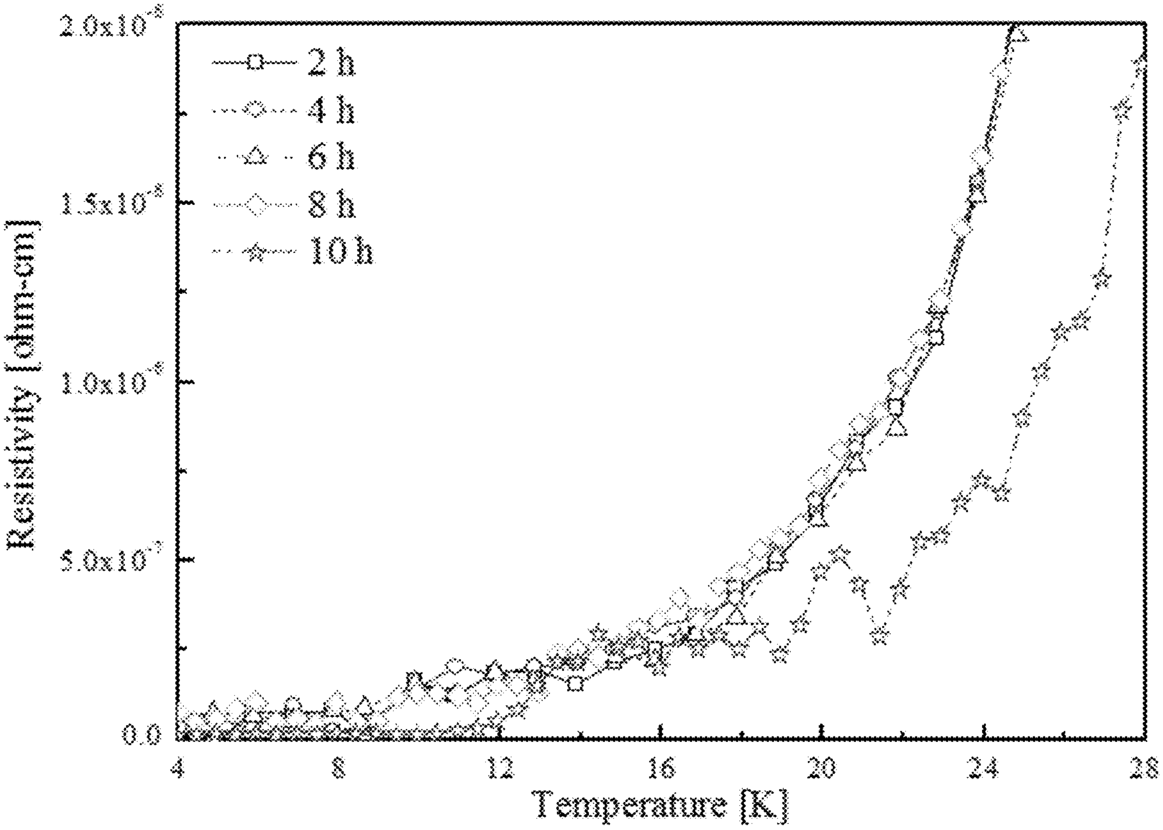
FIG. 23 shows the resistivity versus temperature curves showing the $T_c$ for electrochemical deposition under different time (2-10 h) combined with a subsequent thermal anneal.
Figure 24:
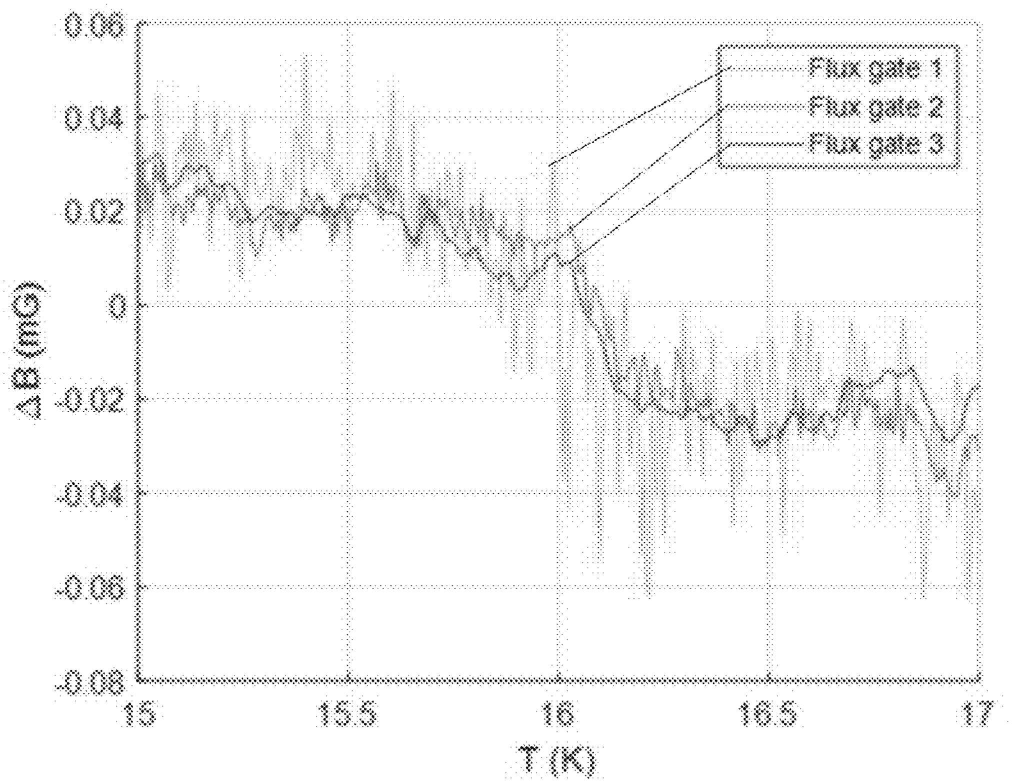
FIG. 24 are flux expulsion curves showing the highest-ever $T_c$ of 16 K for ZrNb alloys (mixed with rock-salt ZrNbC) made from electrochemical deposition combined with thermal annealing.

The $T_c$ of these samples prepared under different deposition times were measured using resistance measurement and flux expulsion. Resistivity drop curves (FIG. 23) show that the 10 h deposited sample has a high $T_c$ of 13 K. Measurements on the thinner films made from shorter deposition time show the substrate Nb $T_c$ of 9 K—there is an instrumental limitation for measuring ultrathin films. Furthermore, flux expulsion tests (FIG. 24) after large-scale deposition show a $T_c$ of 16 K (see details in the next section). 13-16 K $T_c$ are the highest values for ZrNb alloys that are produced under ambient conditions, and these values approach the limit as predicted in simulations. β-ZrNb is believed to be the active phase that delivered these high $T_c$ values. Rocksalt carbide structures can produce $T_c$ up to 11.5 K in experiments.

Large-Scale Electrochemical Deposition for Cornell SRF Sample Test Cavity

Figure 25:
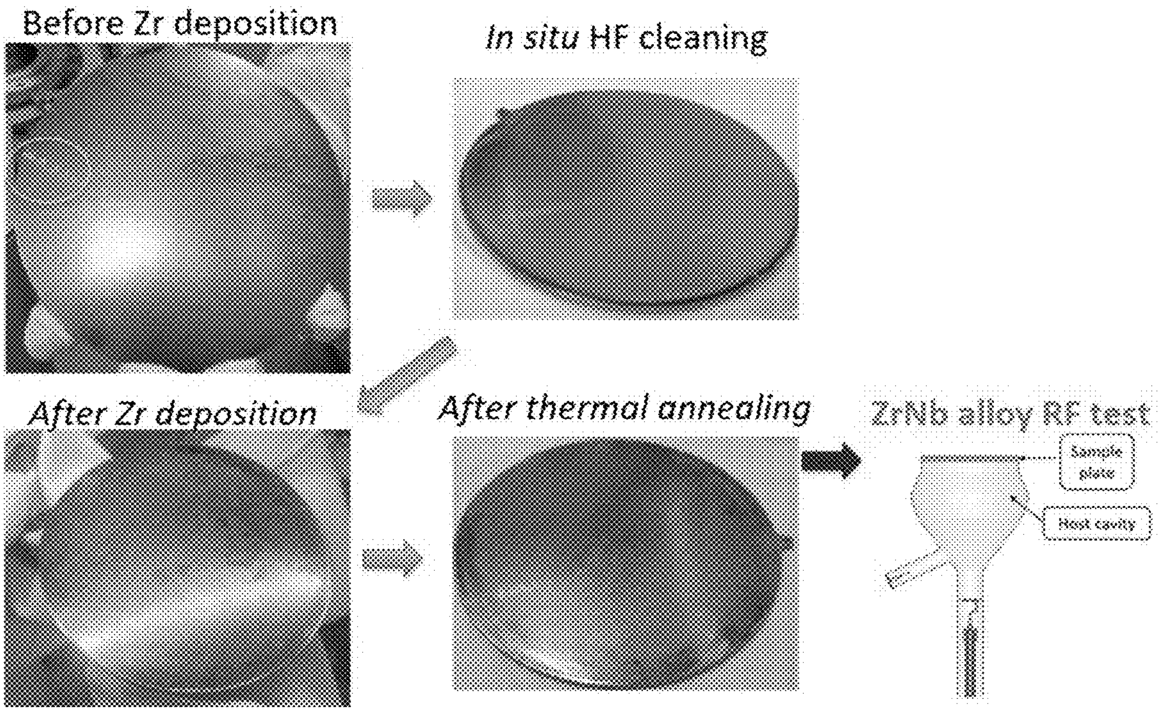
FIG. 25 depicts large-scale electrochemical deposition on the 5 inch sample plate.

To evaluate the RF performance, large-scale electrochemical deposition on a 5-inch sample plate was carried out (FIG. 25). The deposition time was 10 h, but the deposition current density is 6.35 times smaller than the sample-scale deposition, which results in an expected thinner film. The difference in Zr profile is likely the reason for a higher $T_c$ (16 K) as observed in FIG. 24.

Figure 26:
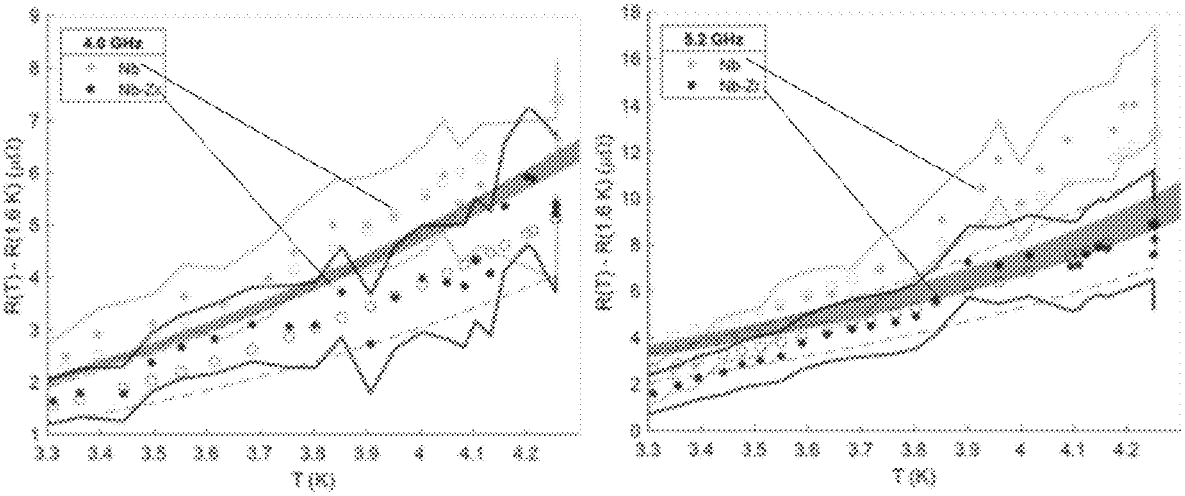
FIG. 26 are plots showing BCS resistance as a function of temperature at 4 GHz and 5.2 GHz frequencies.
Figure 27:
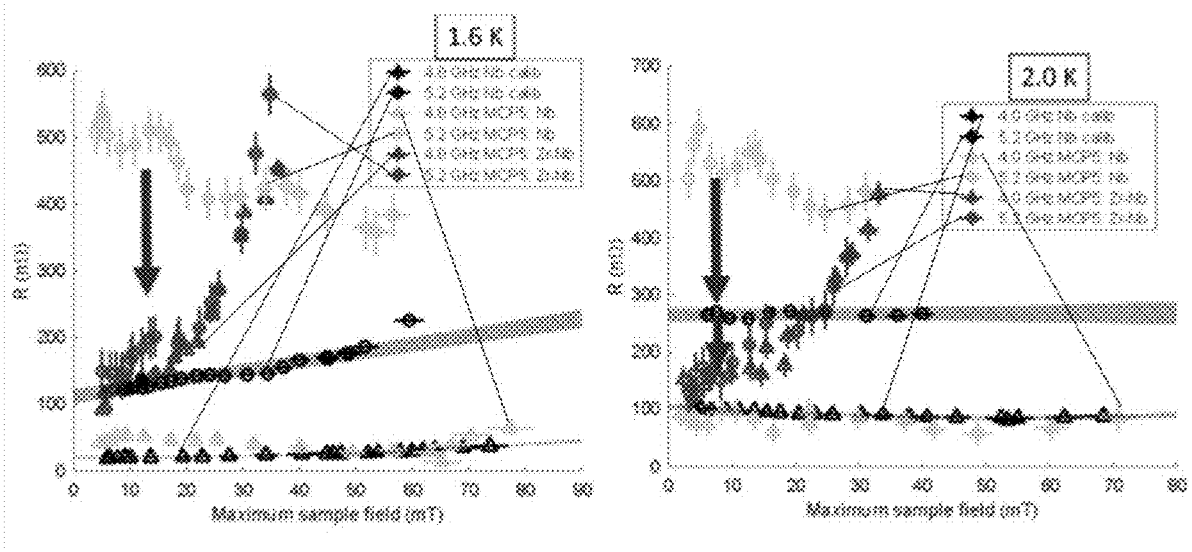
FIG. 27 are plots depicting surface resistance versus field at 1.6 K and 2 K temperatures.
Figure 28:
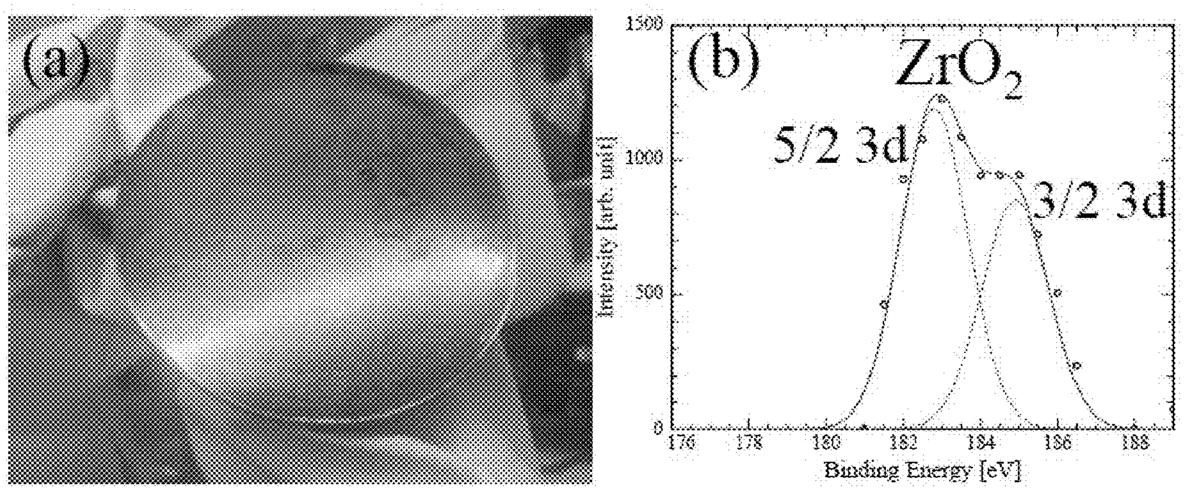
FIG. 28 shows (a) Zr deposition (10 h) on the host plate of Cornell sample test cavity. (b) XPS spectra acquired from the ZrNb(CO) surface after 2 h deposition and subsequent annealing at 600° C. for 10 h, showing low-dielectric-loss zirconium dioxide ($ZrO_2$).
Figure 29:
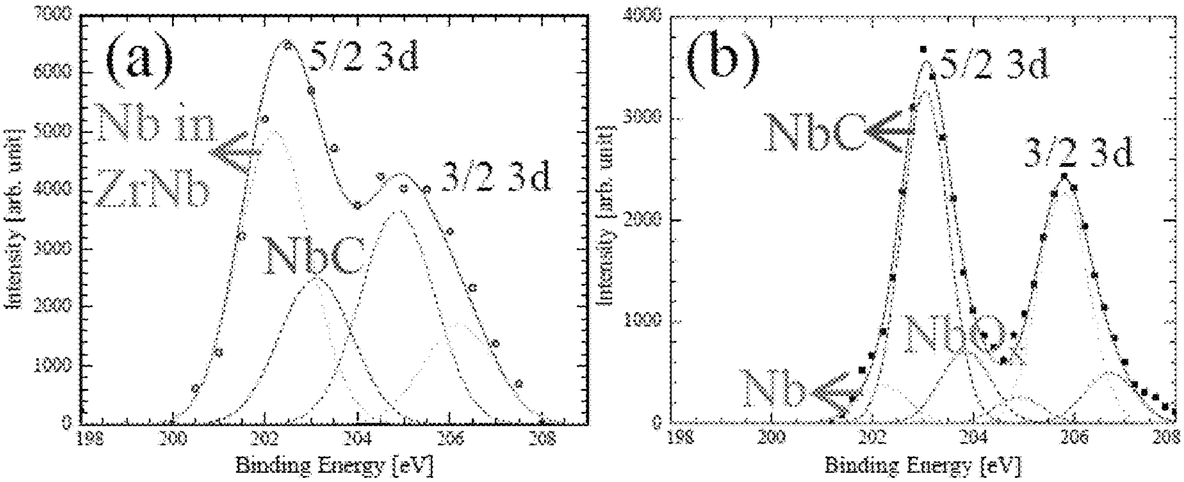
FIG. 29 are plots depicting (a) XPS survey spectra after 300 s of sputtering on ZrNb(CO) samples prepared through a 10 h electrochemical process, followed by annealing at 600° C. for 10 h. (b) High-resolution XPS spectra acquired in situ after 18 s of sputtering on electropolished Nb samples at 500° C. under $7\times10^{-11}$ Torr UHV baking.

Using Cornell SRF sample test cavity, surface resistance was measured at different fields, at different frequencies, and at different operation temperatures as shown in FIGS. 26 and 27. Surface resistance is reversely proportional to the quality factor, and the field is proportional to the accelerating gradient.

In FIG. 26, BCS resistance was calculated using the measured (solid circles) surface resistances subtracted by the value at 1.6 K as a function of temperature at 4.0 GHz and 5.2 GHz frequencies. The solid lines indicate the statistical uncertainty of the measurement. The lighter and darker colors indicate measurements of the niobium substrate before and after the growth of the ZrNb alloy. The shaded black region indicates the calibration sample which was a separate niobium disk with identical preparation. The open circles and dashed lines are model predictions. Despite the statistical uncertainty, the measured surface resistance trends towards a lower value after the growth of the ZrNb layer. This is true at low fields and towards the higher end of the explored temperature range. The possible reduction of BCS resistance owing to a high $T_c$ ZrNb phase is highlighted. The reduction of BCS resistance could be more significant if the thickness of the ZrNb film were much larger than its penetration depth FIG. 27 shows the surface resistance versus field. The highest continuous wave fields that could be supported by the superconducting state were found to decrease from ~75 mT at 4.0 GHz and ~60 mT with the original Nb substrate to ~40 mT after the addition of the ZrNb field.

Conclusions

The foregoing demonstrates that a new type of superconducting radio-frequency (SRF) surface via niobium-zirconium (Nb—Zr) alloying has been demonstrated that enables: a high $T_c$ of 16 K that minimizes energy dissipation and cryogenic costs. The improvement of $T_c$ is achieved after Zr is incorporated into the Nb lattice, and RF results indicate a reduction of BCS resistance. It has been demonstrated that Nb—Zr alloys promise to be a new, feasible technology for accelerator physics.

A ZrNb alloying process was developed via electrochemical deposition and cubic ZrNb surface alloys yielding critical temperature up to 16 K were demonstrated. The first RF result of the ZrNb-alloyed sample test cavity was provided. The most critical finding is the reduction of BCS resistance owing to the high Tc ZrNb alloys in the cavity. This first experimental demonstration of ZrNb alloys may open a new direction for SRF cavities with high critical temperature, low surface resistance and potentially high superheating fields.

Embodiments of the inventive method may be distinguished from the disclosures of publications cited in this specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), "contain" (and any form contain, such as "contains" and "containing"), and any other grammatical variant thereof, are open-ended linking verbs. As a result, a method or product, composition, etc. that "comprises", "has", "includes" or "contains" one or more steps or elements possesses those one or more steps or elements, but is not limited to possessing only those one or more steps or elements. Likewise, a step of a method or an element of a composition or article that "comprises", "has", "includes" or "contains" one or more features possesses those one or more features, but is not limited to possessing only those one or more features.

As used herein, the terms "comprising," "has," "including," "containing," and other grammatical variants thereof encompass the terms "consisting of" and "consisting essentially of."

The phrase "consisting essentially of" or grammatical variants thereof when used herein are to be taken as specifying the stated features, integers, steps or components but do not preclude the addition of one or more additional features, integers, steps, components or groups thereof but only if the additional features, integers, steps, components or groups thereof do not materially alter the basic and novel characteristics of the claimed composition, device or method.

All publications cited in this specification are herein incorporated by reference as if each individual publication were specifically and individually indicated to be incorporated by reference herein as though fully set forth.

Subject matter incorporated by reference is not considered to be an alternative to any claim limitations, unless otherwise explicitly indicated.

Where one or more ranges are referred to throughout this specification, each range is intended to be a shorthand format for presenting information, where the range is understood to encompass each discrete point within the range, and further to encompass any subrange within the range between any discrete point within the range and any other discrete point within the range, as if the same were fully set forth herein.

The invention claimed is:

1. A niobium-zirconium (Nb—Zr) alloy comprising an ordered body-centered cubic (bcc) β-Nb—Zr phase, wherein the Nb—Zr alloy:

comprises less than or equal to 50 at. % Zr; and comprises rock-salt NbZrC or NbC.

2. The Nb—Zr alloy according to claim 1, comprising greater than 50 at. % Nb.

3. The Nb—Zr alloy according to claim 1, comprising 10 to 40 wt. % Zr.

4. The Nb—Zr alloy according to claim 1, wherein Nb and Zr account for at least 50 at. % of the alloy.

5. The Nb—Zr alloy according to claim 1, having a critical temperature (Tc) of 9-17 K under ambient conditions.

6. The Nb—Zr alloy according to claim 1, wherein the Nb—Zr alloy comprises zirconium dioxide ($ZrO_2$).

7. The Nb—Zr alloy according to claim 1, in the form of a film having a thickness of 1 to 25,000 nm.

8. The Nb—Zr alloy according to claim 1, having:

an increased critical field as compared to Nb; and/or reduced BCS resistance as compared to Nb.

9. The Nb—Zr alloy according to claim 1, comprising less than 0.5 wt % hexagonal Zr phase.

10. An Nb substrate comprising, on a surface region thereof, the Nb—Zr alloy according to claim 1.

11. A superconducting radio-frequency (SRF) surface comprising the Nb—Zr alloy according to claim 1, wherein the Nb—Zr alloy is present as a film on the SRF cavity surface.

12. A particle accelerator comprising SRF cavities, wherein the inner surface and/or thin films comprise the Nb—Zr alloy according to claim 1.

13. A quantum computer or quantum computing device comprising:

i) a SRF cavity or a resonator wherein at least a portion of at least one surface of the SRF cavity or resonator comprising the Nb—Zr alloy according to claim 1;

ii) one or more superconducting qubits comprising an inductor made by a superconductor-insulator-superconductor Josephson junction and a linear capacitor (e.g. one or more superconductor pads), wherein at least a portion of the superconductor-insulator-superconductor Josephson junction and/or at least a portion of the superconductor pad(s) comprising one or more layers of the Nb—Zr alloy according to claim 1;

iii) one or more superconducting memories comprising a superconductor-insulator-superconductor Josephson junction and a ferromagnetic dot, wherein the superconductor-insulator-superconductor Josephson junction comprising a write line and a background line, wherein the write line and/or the background line comprising one or more layers of the Nb—Zr alloy according to claim 1; or iv) one or more superconducting nanowire single-photon detectors (SNSPDS) comprising a plurality of superconducting nanowires arranged in a predetermined pattern, wherein the superconducting nanowires comprising the Nb—Zr alloy according to claim 1.

14. A superconductor-insulator-superconductor tunnel junction (SIS) comprising a first superconductor/electrode, a second superconductor/electrode, and a barrier layer between the first superconductor/electrode and the second superconductor/electrode, wherein the first superconductor/electrode and the second superconductor/electrode comprise a niobium-zirconium (Nb—Zr) alloy comprising an ordered body-centered cubic (bcc) β-Nb—Zr phase, wherein the Nb—Zr alloy comprises less than or equal to 50 at. % Zr.

* * * * *